(12) United States Patent
Hosokawa et al.

(10) Patent No.: US 7,432,184 B2
(45) Date of Patent: Oct. 7, 2008

(54) INTEGRATED PVD SYSTEM USING DESIGNATED PVD CHAMBERS

(75) Inventors: Akihiro Hosokawa, Cupertino, CA (US); Makoto Inagawa, Palo Alto, CA (US); Hienminh Huu Le, San Jose, CA (US); John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 414 days.

(21) Appl. No.: 11/213,662

(22) Filed: Aug. 26, 2005

(65) Prior Publication Data

US 2007/0048992 A1    Mar. 1, 2007

(51) Int. Cl.
*H01L 21/00* (2006.01)
*H01L 21/44* (2006.01)

(52) U.S. Cl. .................. 438/597; 438/638; 438/642; 438/646; 438/649; 438/655; 257/E21.19; 257/E21.293; 257/E21.295; 257/E21.311; 257/E21.584

(58) Field of Classification Search ............... 438/597, 438/30, 158, 599, 638, 642, 646, 649, 655, 438/680; 257/499, E21.169, E21.165, E21.171, 257/E21.584, E21.19, E21.293, E21.295, 257/E21.311
See application file for complete search history.

(56) References Cited

U.S. PATENT DOCUMENTS

| 5,474,864 | A | 12/1995 | Isao et al. |
| 5,718,813 | A | 2/1998 | Drummond et al. |
| 5,917,286 | A | 6/1999 | Scholl et al. |
| 5,938,897 | A | 8/1999 | Isao et al. |
| 5,945,161 | A | * 8/1999 | Hashimoto et al. ........ 427/240 |
| 5,993,613 | A | 11/1999 | Manley |
| 5,994,156 | A | * 11/1999 | Voutsas et al. ............ 438/30 |
| 6,001,716 | A | 12/1999 | Liao |
| 6,110,328 | A | 8/2000 | Shimizu et al. |
| 6,228,541 | B1 | 5/2001 | Isao et al. |
| 6,280,585 | B1 | 8/2001 | Obinata et al. |
| 6,296,742 | B1 | 10/2001 | Kouznetsov |
| 6,352,620 | B2 | 3/2002 | Yu et al. |
| 6,361,880 | B1 | 3/2002 | Clevenger et al. |
| 6,416,638 | B1 | 7/2002 | Kuriyama et al. |
| 6,569,577 | B1 | 5/2003 | Isao et al. |
| 6,682,772 | B1 | 1/2004 | Fox et al. |
| 6,689,515 | B2 | 2/2004 | Yoshioka et al. |
| 6,699,790 | B2 | 3/2004 | Kim et al. |
| 6,789,499 | B2 | 9/2004 | Voutsas et al. |
| 6,955,979 | B2 * | 10/2005 | Akram .................. 438/597 |
| 7,221,495 | B2 * | 5/2007 | Miles et al. ............ 359/290 |

(Continued)

*Primary Examiner*—Michael S Lebentritt
(74) *Attorney, Agent, or Firm*—Patterson & Sheridan LLP

(57) ABSTRACT

A method for making a film stack containing one or more metal-containing layers and a substrate processing system for forming the film stack on a substrate are provided. The substrate processing system includes at least one transfer chamber coupled to at least one load lock chamber, at least one first physical vapor deposition (PVD) chamber configured to deposit a first material layer on a substrate, and at least one second PVD chamber for in-situ deposition of a second material layer over the first material layer within the same substrate processing system without breaking the vacuum or taking the substrate out of the substrate processing system to prevent surface contamination, oxidation, etc. The substrate processing system is configured to provide high throughput and compact footprint for in-situ sputtering of different material layers in designated PVD chambers.

7 Claims, 14 Drawing Sheets

U.S. PATENT DOCUMENTS

| | | |
|---|---|---|
| 2001/0018154 A1 | 8/2001 | Yoshioka et al. |
| 2002/0124866 A1 | 9/2002 | Asari et al. |
| 2003/0022487 A1* | 1/2003 | Yoon et al. .................. 438/642 |
| 2003/0085115 A1 | 5/2003 | Tani et al. |
| 2003/0180126 A1 | 9/2003 | Poole |
| 2004/0007247 A1 | 1/2004 | Asari et al. |
| 2004/0050687 A1 | 3/2004 | Lee et al. |
| 2004/0074769 A1 | 4/2004 | Morinaka et al. |
| 2004/0112735 A1 | 6/2004 | Saigal et al. |
| 2004/0231973 A1 | 11/2004 | Sato et al. |
| 2006/0211243 A1* | 9/2006 | Ishizaka et al. ............. 438/680 |

* cited by examiner

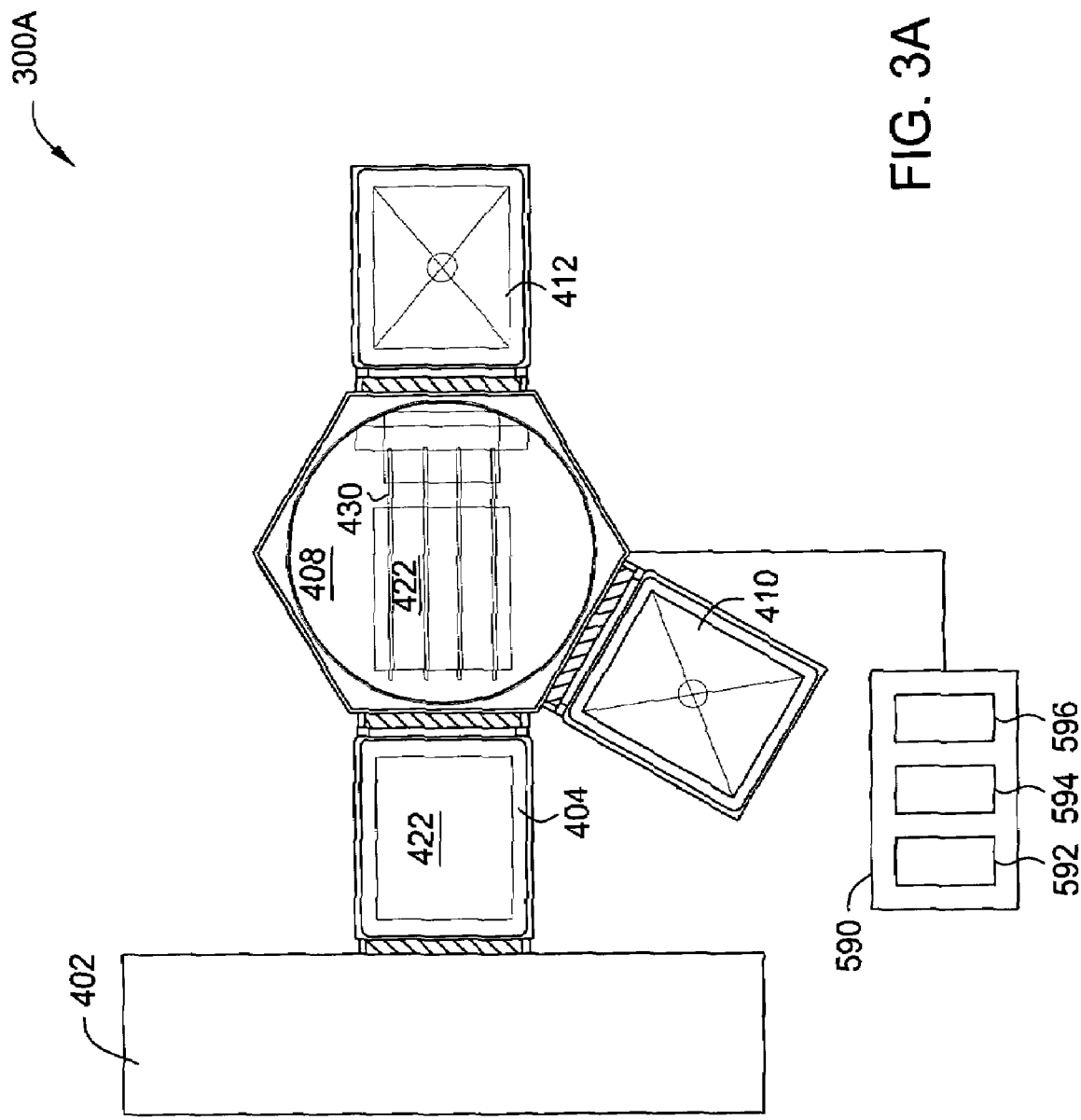

INTEGRATED PVD SYSTEM USING DESIGNATED PVD CHAMBERS

BACKGROUND OF THE INVENTION

1. Field of the Invention

Embodiments of the invention generally relate to an apparatus and method for substrate processing of a multilayer film stack. The invention is particularly useful for fabrication of flat panel displays.

2. Description of the Related Art

Fabrication of semiconductor integrated circuits (IC) and flat panel display (FPD) devices require processing of multilayer film stacks to create devices, conductors and insulators on a substrate. One example of a multilayer film stack is a thin film transistor (TFT) structure useful for fabricating liquid crystal display (LCD) devices. FIG. 1 depicts an exemplary bottom gate structure of a thin film transistor 1 having a glass substrate 10 and an optional underlayer 20 formed thereon. A bottom gate formed on the underlayer 20 comprises a gate electrode layer 30 and a gate insulation layer 40. The gate electrode controls the movement of charge carriers in a transistor. The gate insulation layer 40 electrically isolates the gate electrode layer 30 from a bulk semiconductor layer 50 and a doped semiconductor layer formed thereover, each of which may function to provide charge carriers to the transistor. A source region 70a and a drain region 70b formed in the doped semiconductor layer 70 is patterned and isolated by an interlayer dielectric/etch stop layer 60 formed over the bulk semiconductor layer 50. A conductive layer 80 is deposited over the doped semiconductor layer 70 to form a source contact 80a disposed on the source region 70a and a drain contact 80b disposed on the drain region 70b. Finally, a passivation layer 90 encapsulates the thin film transistor 1 to protect the transistor from environmental hazards such as moisture and oxygen. The gate electrode layer 30 generally comprises a conductive metal material. The gate dielectric layer 40, the bulk semiconductor layer 50, and the doped semiconductor layer 70 generally comprises a silicon-containing material. Another example includes a top gate thin film transistor (TFT) structure, among others.

In general, the substrate for device fabrication is subjected to various processes, such as sputtering, chemical vapor deposition (CVD), physical vapor deposition (PVD), lithography, etching, ion implantation, ashing, cleaning, heating, annealing, and the like in a specific multi-step fabrication sequence to process layers of metal and silicon containing films thereon. For example, the substrate is processed through steps of deposition, patterning, lithography and etching repeated multiple times. Typically, a process chamber is usually configured to deposit a single layer on a substrate. In addition, a number of process chambers can also be coupled together to a central transfer chamber for multi-substrate processing in a multi-substrate processing platform, such as a cluster tool, examples of which are the families of AKT PECVD, PRODUCER®, CENTURA® and ENDURA® processing platforms available from Applied Materials, Inc., of Santa Clara, Calif.

Physical vapor deposition (PVD), or sputtering, is one of the most commonly used processes in devices fabrication. PVD is a plasma process performed in a vacuum process chamber where a negatively biased target with respect to a chamber body or a grounded sputter shield is exposed to a plasma of a gas mixture comprising gases such as inert gases (e.g., argon (Ar)). Bombardment of the target by ions of the inert gas results in ejection of atoms of the target material. In some case, a magnetron is positioned in the back of the target to project a magnetic field parallel to the front side of the target to trap electrons and increase plasma density and sputtering rate. The ejected atoms accumulate as a deposited film on a substrate placed on a substrate pedestal disposed within the process chamber.

As the demand for semiconductor and flat panel devices continues to grow, there is a trend to reduce cost by increasing the sizes of the substrates for large scale fabrication. For example, glass substrates utilized for flat panel fabrication, such as those utilized to fabricate computer monitors, large screen televisions, displays for PDAs and cell phones and the like, have increased in size from 550 mm×650 mm to 1500 mm×1800 mm in just a few years and are envisioned to exceed four square meters in the near future. The dimension of a process chamber or a multi-substrate processing platform has become very large.

Thus, the dimension of the target for such process chamber is ever so large, it is not easy to change the target into a target of a different material during substrate processing which greatly reduce the throughput, especially for processing multiple substrates. This is especially troublesome when two or more material layers need to be sequentially deposited on a given substrate, and the deposition time and throughput are severely compromised. It is desirable to design a PVD processing system to accommodate sequential processing steps in the same tool for processing a number of such large area substrates in a compact and reduced footprint without the need to change the target, change tools, break vacuum, or compromise throughput.

Therefore, there is a need for an improved method and apparatus to sputter multilayer thin films on a substrate.

SUMMARY OF THE INVENTION

Embodiments of a substrate processing system, process chambers and processing method for in-situ processing of one or more substrates are provided. In one embodiment, a substrate processing system for processing one or more substrates includes a load lock chamber adapted to load and unload the one or more substrates into the substrate processing system, a transfer chamber coupled to the load lock chamber, and at least one first physical vapor deposition (PVD) chamber having a first target comprising molybdenum (Mo). The at least one first PVD chamber is configured to deposit a molybdenum layer to a thickness of about 100 Å to about 1500 Å on the surface of the one or more rectangular substrates. The substrate processing system further includes at least one second PVD chamber having a second target comprising a material selected from the group consisting of aluminum (Al), neodymium (Nd), aluminum neodymium (AlNd), molybdenum nitride ($Mo_xN_y$), copper (Cu), their metal nitrides, metal alloys, and combinations thereof. The at least one second PVD chamber is designated to deposit a layer of said material to a thickness of about 1750 Å to about 3500 Å on the surface of the one or more rectangular substrates. The vacuum robot is adapted to be coupled to and rotably movable among the load lock chamber, the at least one first PVD chamber, and the at least one second PVD chamber. In one aspect of the invention, said material layer is thicker than the molybdenum layer. In another aspect of the invention, the substrate processing system is configured with an improved throughput of at least about 30 substrates per hour.

In another embodiment, a substrate processing system with improved throughput of about 33 substrates or more per hour may include a first PVD chamber, a second PVD chamber, and a third PVD chamber such that a vacuum robot is adapted to be coupled to and rotably movable among a load lock chamber and the first, the second, and the third PVD chambers. The first PVD chamber includes a first target comprising molybdenum (Mo) and is configured to deposit a first molybdenum layer to a thickness of about 100 Å to about 1500 Å on the surface of the one or more substrates. The second PVD chamber includes a second target comprising a material selected from the group consisting of aluminum (Al), neodymium (Nd), aluminum neodymium (AlNd), molybdenum nitride ($Mo_xN_y$), copper (Cu), their metal nitrides, metal alloys, and combinations thereof, and is designated to deposit a layer of said material to a thickness of about 1750 Å to about 3500 Å on the surface of the one or more substrates. The third PVD chamber includes a third target comprising molybdenum (Mo) and is configured to deposit a second molybdenum layer to a thickness of about 100 Å to about 1500 Å on the surface of the one or more substrates.

In still another embodiment, a method of processing a film stack containing one or more metal-containing layers on a substrate in a substrate processing system is provided. The method includes depositing a molybdenum layer to a thickness of about 100 Å to about 1500 Å on the substrate in a first PVD chamber having a first target which comprises molybdenum, transferring the substrate to a second PVD chamber of the same substrate processing system, and depositing a layer of a material selected from the group consisting of aluminum (Al), neodymium (Nd), aluminum neodymium (AlNd), molybdenum nitride ($Mo_xN_y$), copper (Cu), their metal nitrides, metal alloys, and combinations thereof to a thickness of about 1750 Å to about 3500 Å on the surface of the substrate without breaking vacuum in the second PVD chamber having a second target which comprises said material. In one aspect of the invention, the thickness of the molybdenum layer is less than the thickness of said material layer.

In yet another embodiment, a method of processing a film stack containing two or more metal-containing layers on two or more substrates in a substrate processing system having three or more physical vapor deposition (PVD) chambers includes depositing on a first substrate a first molybdenum layer to a thickness of about 100 Å to about 1500 Å in a first PVD chamber having a first target which comprises molybdenum, transferring the first substrate to a second PVD chamber having a second target which comprises a material selected from the group consisting of aluminum (Al), neodymium (Nd), aluminum neodymium (AlNd), molybdenum nitride ($Mo_xN_y$), copper (Cu), their metal nitrides, metal alloys, and combinations thereof, depositing on a second substrate a second molybdenum layer to a thickness of about 100 Å to about 1500 Å in the first PVD chamber, and transferring the second substrate to a third PVD chamber of the same substrate processing system having a third target which comprises said material. The method further includes depositing a first layer of said material to a thickness of about 1750 Å to about 3500 Å over the first molybdenum layer on the surface of the first substrate in the second PVD chamber without breaking vacuum and depositing a second layer of said material to a thickness of about 1750 Å to about 3500 Å over the second molybdenum layer on the surface of the second substrate in the third PVD chamber without breaking vacuum. The thickness of the first molybdenum layer may be less than the thickness of the first layer of said material on the surface of the first substrate, and the thickness of the second molybdenum layer may be less than the thickness of the second layer of said material on the surface of the second substrate. In one aspect of the invention, the method improves the throughput of the substrate processing to about 50 substrates or more per hour or about 54 substrates or more per hour; such a high throughput can be obtained for processing one or more large area rectangular substrates.

In an alternative embodiment, a method of processing a film stack may include depositing on a first substrate a first layer of a material selected from the group consisting of aluminum (Al), neodymium (Nd), aluminum neodymium (AlNd), molybdenum nitride ($Mo_xN_y$), copper (Cu), their metal nitrides, metal alloys, and combinations thereof to a thickness of about 1750 Å to about 3500 Å in a first PVD chamber having a first target which comprises said material, depositing on a second substrate a second layer of said material to a thickness of about 1750 Å to about 3500 Å in a second PVD chamber of the same substrate processing system having a second target which comprises said material, transferring the first substrate to a third PVD chamber of the same substrate processing system having a third target which comprises molybdenum, and depositing on the surface of the first substrate a first molybdenum layer to a thickness of about 100 Å to about 1500 Å over the first layer of said material in the third PVD chamber without breaking vacuum. In addition, the second substrate is transferred to the third PVD chamber and a second molybdenum layer is deposited on the surface of the second substrate to a thickness of about 100 Å to about 1500 Å over the second layer of said material in the third PVD chamber without breaking vacuum.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3A is a plan view of an exemplary cluster tool configured for in-situ processing of a film stack according to one embodiment of the invention.

DETAILED DESCRIPTION

The invention provides a method and a substrate processing system for in-situ processing of a film stack containing one or more metal-containing layers on a large area substrate without the need to change the large dimension target frequently, changing the processing systems, breaking the vacuum, or cleaning the substrate in between the metal-containing layers. The metal-containing layers can be processed in high volume by designated physical vapor deposition (PVD) sputtering chambers in a specific order to maximize the throughput and enable multi-substrate processing. For example, the substrate processing system may include two or more designated PVD chambers in which two or more metal materials are sequentially and in-situ deposited on one or more substrates by exposing to gas-phase materials or plasma.

In one embodiment, a cluster type substrate processing system is provided and included at least one first PVD process chamber configured to deposit a first metal material layer on a substrate and at least one second PVD process chamber for in-situ deposition of a second metal material layer over the first metal material layer without breaking vacuum or any surface treatment on the surface of the substrate. In another embodiment, the substrate processing system is also configured to include other types of process chambers to perform additional etching, deposition, annealing, and cleaning processes.

Figure 1:
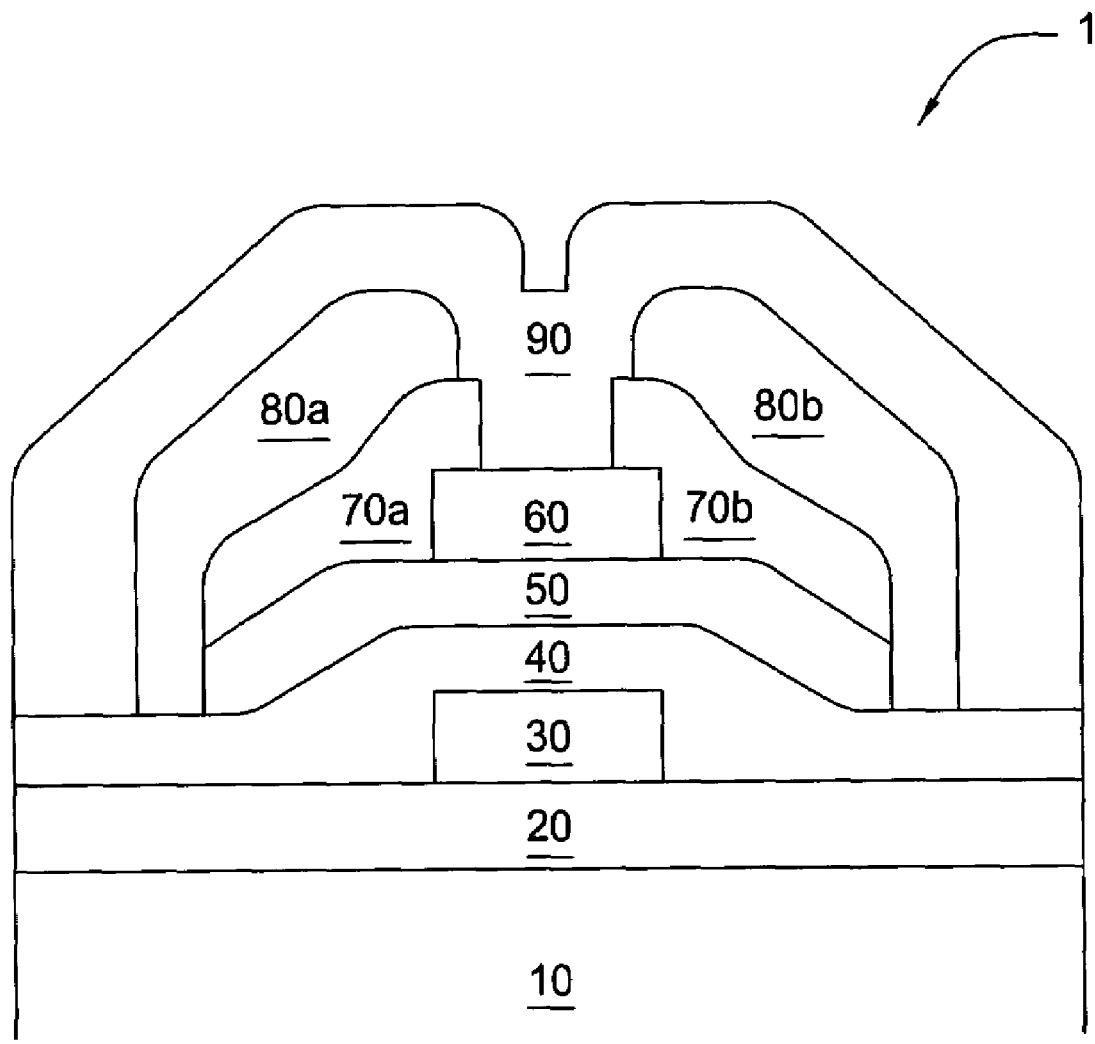
FIG. 1 depicts a cross-sectional schematic view of an exemplary bottom gate thin film transistor.
Figure 2:
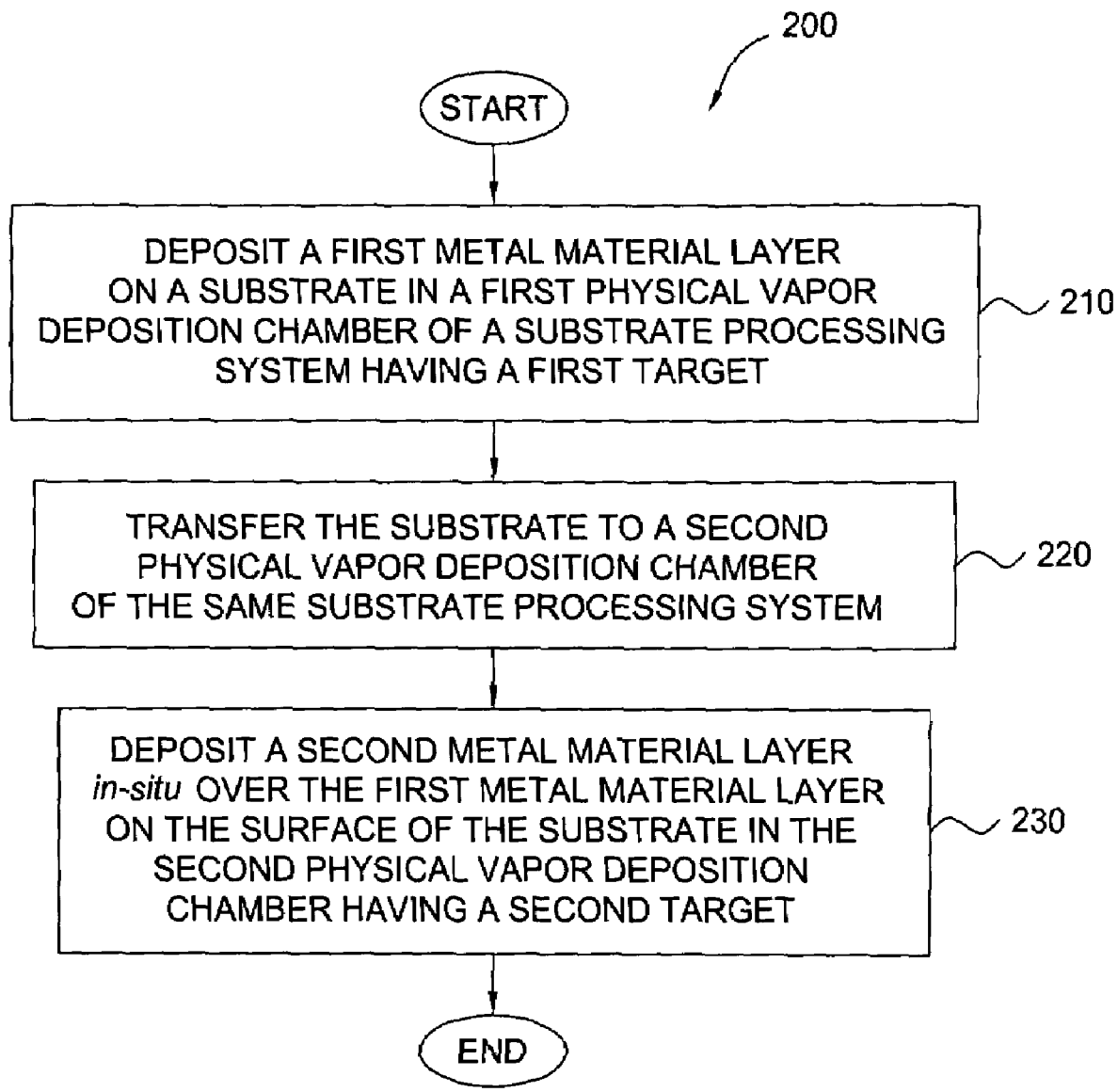
FIG. 2 depicts a flow diagram of an exemplary method for in-situ processing of a film stack according to one embodiment of the invention.

FIG. 2 illustrates a flow chart of a method 200 for high throughput in-situ processing of a film stack on a substrate according to one or more embodiments of the invention. The film stack may include multiple layers of different materials at varied thickness. Generally, depositing two layers on one or more substrates will affect the throughput at least two fold, e.g., half the throughput as compared to depositing a single layer on the one or more substrates. The throughput of a substrate processing system is generally represented by TACT time (Total Actual Cycle Time, the time period required for a substrate to be processed/cycled inside a tool, e.g., seconds/substrate) or enhanced numbers of substrates that a process tool can handled in a hour (no. of substrates/hour).

The substrate of the invention may be of varying shapes or dimensions. For flat panel display application, the substrate may comprise a material that is essentially optically transparent in the visible spectrum, for example glass or clear plastic. For example, for thin film transistors applications, the substrate may be a large area glass substrate having a high degree of optical transparency with a surface area of about 370 mm×470 mm or larger, such as about one square meters or larger. However, the invention is equally applicable to substrate processing of any types and sizes. Substrates of the invention can be circular, square, rectangular, or polygonal for flat panel display manufacturing.

In one embodiment, the substrate processing system of the invention is adapted to process a rectangular substrate. The surface area of a rectangular substrate for flat panel display is typically large, for example, a rectangle of about one square meter or larger, such as at least about 300 mm by about 400 mm, e.g., about 120,000 mm$^2$ or larger. In addition, the invention applies to any devices, such as flat panel display (FPD), flexible (rollable) display, organic light emitting diode (OLED) displays, flexible organic light emitting diode (FOLED) display, polymer light emitting diode (PLED) display, liquid crystal displays (LCD), organic thin film transistor, active matrix, passive matrix, top emission device, bottom emission device, solar cell, solar panel, etc., and can be on any of the silicon wafers, glass substrates, metal substrates, plastic films (e.g., polyethylene terephthalate (PET), polyethylene naphthalate (PEN), etc.), plastic epoxy films, among others.

At step 210, a first metal material layer is deposited on a substrate in a first PVD chamber of a substrate processing system. The first PVD chamber generally includes a first target which comprises the first metal material for sputtering the first metal material layer on the substrate and other target materials and components for structural support. Suitable first metal materials include, but are not limited to, aluminum neodymium (AlNd), aluminum nitride ($Al_xN_y$), molybdenum nitride ($Mo_xN_y$), titanium nitride (TiN), tantalum nitride (TaN), aluminum (Al), molybdenum (Mo), neodymium (Nd), tungsten (W), chromium (Cr), tantalum (Ta), titanium (Ti), copper (Cu), other metal nitrides, metal alloys, and combinations thereof.

At step 220, the substrate is transferred to a second PVD chamber of the same substrate processing system for in-situ substrate processing without taking the substrate out of the vacuum environment of the substrate processing system. At step 230, a second metal material layer is deposited in situ over the first metal material layer on the surface of the substrate in the second PVD chamber having a second target. The second target in the second PVtD chamber comprises the second metal material for sputtering the second metal material layer and may also include other materials or components for structural support. Suitable second metal materials include, but are not limited to, aluminum (Al), molybdenum (Mo), neodymium (Nd), aluminum neodymium (AlNd), tungsten (W), chromium (Cr), tantalum (Ta), titanium (Ti), copper (Cu), aluminum nitride ($Al_xN_y$), molybdenum nitride ($Mo_xN_y$), titanium nitride (TiN), tantalum nitride (TaN), other metal nitrides, metal alloys, and combinations thereof.

In one embodiment, the first metal material layer may be used in a thin film transistor structure and may include one or more gate metal layers, conductor layers, or gate electrode layers to a thickness of about 50 Å to about 5000 Å. In another embodiment, the first metal material to be deposited on the substrate, thus, the first target material in the designated first PVD chamber, is chosen as a barrier material to prevent any chemical reaction between an underlying layer on the surface of the substrate and any subsequent material layers which may need to be deposited onto the substrate. As an example, a pure aluminum layer will tend to react to a substrate surface when silicon-containing materials are exposed on the substrate surface, and there is a need for a barrier layer, such as a molybdenum layer or other barrier materials, to be deposited on the substrate before and/or after the pure aluminum layer is deposited onto the substrate surface.

In addition, the first metal material layer may include more than one layer. For example, a metal material layer and its metal alloy material layer may be deposited as the first metal material layer using the substrate processing system of the invention. Alternatively, the first metal material layer may include a metal alloy material of a second metal material layer such that the first metal material layer is serving as a barrier material layer for the subsequent second metal material layer. In one example, a molybdenum nitride ($Mo_xN_y$) layer can be deposited before a subsequent molybdenum (Mo) layer, where the molybdenum nitride layer can be served as a barrier layer for the molybdenum layer. As another example, aluminum neodymium (AlNd), a alloy of aluminum can be the first metal material.

In another embodiment, the second metal material may be used as a gate metal layer, a conductor layer, or a gate electrode layer, to a thickness of about 50 521 to about 5000 Å. In still another embodiment, the second metal material is a different material than the first metal material. In a further embodiment, the second metal material is provided to enhance conductivity of a film stack containing the first and the second metal material layers. For example, a molybdenum layer can be deposited before or after an aluminum neodymium (AlNd) layer on a substrate surface to increase the conductivity of a final film stack comprising molybdenum and aluminum neodymium since the conductivity of a single aluminum neodymium layer is not high enough for some applications.

In accordance with one or more aspects of the invention, the first and the second PVD chambers having the first and the second targets are designated such that there is no need to change the bulky and heavy targets for sequential deposition of the two or more metal materials on the large area substrate during in-situ substrate processing. In addition, three designated PVD chambers can be used for a three-layer film stack sequentially deposited on a substrate using the substrate processing system of the invention, which may further include a third target in a third PVD chamber.

For example, the method 200 in FIG. 2 may further include in-situ deposition of a third layer using a third PVD chamber of the same substrate processing system. The third PVD chamber generally includes a third target, which comprises a third material, including, but not limited to, aluminum (Al), molybdenum (Mo), neodymium (Nd), aluminum neodymium (AlNd), aluminum nitride ($Al_xN_y$), molybdenum nitride ($Mo_xN_y$), tantalum (Ta), titanium (Ti), copper (Cu), titanium nitride (TiN), tantalum nitride (TaN), tungsten (W), chromium (Cr), other metal nitrides, metal alloys, and combinations thereof.

In one embodiment, one or more additional layers may be deposited over the second metal material layer using two designated PVD chambers or three designated PVD chambers. For example, a third metal material layer may be deposited over the second metal material layer to serve as a barrier layer and prevent the second metal material layer from reacting with any subsequent layers. As an example, a molybdenum layer can be deposited over an aluminum layer to reduce the chance of surface reaction with any subsequent silicon-containing material layer which may need to be deposited over the aluminum and molybdenum layers. In another embodiment, the third target in the third PVD chamber of the invention, may include the first metal material for depositing the first metal material over the second metal material layer in a sandwiched 3-layer film stack (first metal-second metal-first metal) on surface of the substrate.

Accordingly, the film stack of the invention deposited using methods of the invention may include, but not limited to, a single layer of molybdenum, or a triple layer of molybdenum, aluminum, and molybdenum which are deposited using two, three or more designated PVD chambers. For example, the two or more targets in the two or more designated PVD chambers may each comprise an aluminum material or a molybdenum material for depositing the triple layer of molybdenum, aluminum, and molybdenum on the substrate.

As another example, the film stack of the invention may be a triple layer of titanium, aluminum, and titanium, or a triple layer of titanium nitride, aluminum, and titanium nitride. Other example may include a layer of molybdenum underneath and a layer of aluminum neodymium over the molybdenum layer, or alternatively, a first layer of aluminum neodymium and a layer of molybdenum deposited over the aluminum neodymium layer.

Another example includes a layer of chromium and a layer of aluminum neodymium. Another example may be two layers of aluminum nitride. Further, a film stack containing copper and various barrier materials suitable for copper, such as a first layer comprising molybdenum, tantalum, or tantalum nitride, etc., and a second layer comprising copper, can be deposited using the method and substrate processing system of the invention.

The film stack of the invention may be deposited on a substrate for fabricating a bottom gate thin film transistor (TFT) having a back channel etch (BCE) inverted staggered structure, or alternatively, a top gate thin film transistor. For example, the film stack of the invention may be deposited as a gate electrode layer having a thickness of about 5000 Å or less, such as from about 50 Å to about 4000 Å or from about 500 Å to about 3000 Å. As another example, the film stack of the invention may be deposited as a conductive layer or as a source/drain material layer having a thickness of about 7500 Å or less, such as from about 100 Å to about 6000 Å.

However, the thickness for the film stack of the invention is not limiting and may vary depending on the types of suitable metal materials and thus their material properties. For example, molybdenum can be deposited to a thickness of about 100 Å to about 3500 Å, such as a single molybdenum layer of about 2500 Å. As another example, a molybdenum layer having a thickness of about 100 Å to about 1500 Å, such as a molybdenum layer of about 500 Å or about 1000 Å, can be deposited before or after a different metal material layer.

In addition, aluminum (Al), neodymium (Nd), aluminum neodymium (AlNd), aluminum nitride ($Al_xN_y$), molybdenum nitride ($Mo_xN_y$), copper (Cu), tungsten (W), chromium (Cr), and other conductive metal materials can be deposited into a thickness of about 500 Å or more, such as about 1750 Å to about 3500 Å. Further, tantalum (Ta), titanium (Ti), titanium nitride (TiN), tantalum nitride (TaN), and other barrier metal materials can be deposited to a thickness of, for example, about 10 Å to about 1000 Å.

As an example, aluminum neodymium can be deposited to a thickness of about 3500 Å or less, such as about 1750 Å to about 3500 Å, e.g., about 2000 Å to about 3000 Å, or about 2500 Å.

According to one or more aspects of the invention, two or more designated PVD chambers are used to deposit the first and the second metal material layers having varied thickness on the surface of a substrate for high throughput substrate processing, and there is no need to change the large dimension and heavy chamber lid, which generally includes the target, the magnetron (if electromagnetic scanning is used in conjunction with the target), and other components of the substrate processing system. The target, lid assembly, and related chamber components for PVD or sputtering are generally required to be somewhat larger than the substrate to provide uniform deposition across the whole surface of the substrate.

Further, since the surface of the first metal material layer is immediately transferred to the second PVD chamber and kept in the vacuum environment of the same substrate processing system, air and other contaminants are unlikely to penetrate the surface of the substrate and there is no additional need for surface cleaning, such as using a hydrofluoric acid cleaning solution.

In another embodiment, only two designated PVD chambers are needed for compact footprint and high throughput processing to sequentially deposit the three-layer film stack on a substrate. For example, after the second metal material layer is deposited on the substrate by the second PVD chamber, the first PVD chamber can be used to deposit a third material layer over the second metal material layer on the surface of the substrate. In this embodiment, the method 200 of the invention further includes transferring the substrate back to the first PVD chamber and depositing a layer of a third material over the second metal material layer in the first physical vapor deposition chamber without breaking vacuum. This is especially suitable when the first metal layer is thinner (in thickness) than the second metal material in order to reduce the footprint of the substrate processing system (only two process chambers designated) and still obtain a high throughput when multiple substrates are processed. Since a thinner film takes less time to deposit, the three material layers with different thickness of thin-thick-thin or with different materials of first metal-second metal-first metal can be efficiently deposited in the two specific designated PVD chambers using methods of the invention with convenient target configurations already adapted to the substrate processing systems of the invention. Generally, processing a three-layer film reduces the throughput three-fold as compared to a single layer film. It is observed that, using the methods and substrate processing systems of the invention, a throughput of at least about 30 substrates per hour can be obtained for a three-layer film in two designated process chambers and a throughput of at least about 60 substrates per hour or at least about 75 substrates per hour can be obtained for a single layer film. Another example includes a throughput of at least about 33 substrates per hour, e.g., about 37 substrates per hour, for a three-layer film using three designated process chambers.

However, the invention is not limited to any specific thickness of the first, the second, and/or the third material layers using either two designated PVD chambers or three designated chambers and still obtain very high substrate processing throughput. The substrate processing system of the invention is configured such that a throughput of at least about 30 substrates per hour is desirably obtained. In addition, for depositing a two-layer film stack having different thickness of a first material layer and a second material layer, it is contemplated that the throughput of the substrate processing system can be further improved by using the method 200 of the invention to further include depositing a material layer which is one of the thicker layer of the first metal material layer and the second metal material layer in a designated third PVD chamber. It is observed a throughput of at least about 40 substrates per hour, such as at least about 42 substrates per hour, is obtained for a two-layer film using two designated, process chambers, and a higher throughput of at least about 50 substrates per hour, such as at least about 54 substrates per hour, is obtained for a two-layer film using three designated process chamber.

As an example, for processing the two-layer film stack on multiple substrates, a first substrate is processed by designating a first and a second process chambers and a second substrate is processed by designating a first and a third process chambers, wherein one shared process chamber is designated to increase throughput and reduce chamber idle time. In detail, a method of processing a film stack containing two or more layers on two or more substrates in a substrate processing system having three or more process chambers may include the steps of depositing a layer of a first metal material on a first substrate in a first PVD chamber having a first target which comprises the first metal material, and transferring the first substrate to a second PVD chamber of the same substrate processing system having a second target which comprises the second metal material. The method may also include depositing a layer of the first metal material on a second substrate in the first PVD chamber and transferring the second substrate to a third PVD chamber of the same substrate processing system having a third target which comprises the second metal material. In addition, a thicker layer of a second metal material different from the first metal material layer is deposited over the first metal material layer on the surface of the first substrate in the second PVD chamber without breaking vacuum and a thicker layer of a second metal material is deposited over the first metal material layer on the surface of the second substrate in the third PVD chamber without breaking vacuum.

As another example, the second layer may be thinner than the first layer. In this case, a method for processing the two-layer film stack on multiple substrates in a substrate processing system may include depositing a layer of a first metal material on a first substrate in a first PVD chamber having a first target which comprises the first metal material and depositing a layer of the first metal material on a second substrate in a second PVD chamber of the same substrate processing system having a second target which comprises the first metal material. The method further include transferring the first substrate to a third PVD chamber of the same substrate processing system having a third target which comprises the second metal material, depositing a thinner layer of a second metal material different from the first metal material layer over the first metal material layer on the surface of the first substrate in the third PVD without breaking vacuum and transferring the second substrate to the third PVD chamber, and depositing a thinner layer of the second metal material over the first metal material layer on the surface of the second substrate in the third PVD chamber without breaking vacuum. In this example, a very high throughput of at least about 50 substrates per hour, such as about 54 substrates or more per hour, can be obtained for a two-layer film using the method and three designated process chambers in the substrates processing systems of the invention.

Referring back to FIG. 2, after step 230, the deposited film stack having the first metal material, the second metal material, and other materials on the surface of the substrate is inspected and additional deposition, patterning and etching steps can be performed. For example, a layer of photoresist may be coated over the surface of the substrate and a mask having a pattern may be applied onto the surface. The deposited film stack may then be etch using a dry etch process, a wet etch process, among others, to etch one or more layers of the deposited metal layers. In one aspect, it may require etching using different masks for different layers which need to be etched. In another aspect, oxygen ashing, ion-implant, or other plama treatment may be needed to remove portions of the photoresist material before additional one or more etching processes are performed on the surface of the substrate.

In addition, one or more surface treatments can be performed prior to deposition of the film stack of the invention or after deposition of the film stack on the surface of the substrate. For example, the substrate may be heated by using a radiant heat lamp, inductive heater, or an IR type resistive heater, and/or annealed in an annealing chamber. As another example, the substrate may be chemically cleaned prior to or the steps of the method 200 using any of the cleaning solutions known in the art, such as a distilled water solution, a sulfuric acid solution, a hydrofluoric acid solution, among others. The method 200 may further include etching to form a pattern on the surface of the substrate before the step 210 using the same or different substrate processing system as in the method 200. One embodiment of the invention includes that these additional processes can be performed in the same substrate processing system in the method 200. Another embodiment of the invention includes additional substrate processing system to perform one or more of these additional processes.

FIGS. 3A-5 are top plan views of exemplary substrate processing systems 300A, 300B, 400, 500 suitable for sputtering multi-layers of metal films on a substrate 422 according to embodiments of the invention. The substrate processing systems 300A, 300B, 400, 500 typically include a transfer chamber 408 coupled to a factory interface 402 via a load lock chamber 404.

The factory interface 402 generally includes one or more substrates stored therein or substrate storage cassettes. The substrate storage cassettes are typically removably disposed in a plurality of storage bays/compartments formed inside the factory interface 402. The factory interface 402 may also include an atmospheric robot, such as a dual blade atmospheric robot. The atmospheric robot is adapted to transfer one or more substrates between the one or more substrate storage cassettes and the load lock chamber 404. Typically, the factory interface 402 is maintained at or slightly above atmospheric pressure and the load lock chamber 404 is disposed to facilitate substrate transfer between a vacuum environment of the transfer chamber 408 and a generally ambient environment of the factory interface 402. The substrate 422 processed by the substrate processing systems of the invention can be transferred from the factory interface 402 to the load lock chamber 404 for processing of a fabrication sequence including two or more in-situ metal layer deposition on one or more substrates 422.

Figure 6:
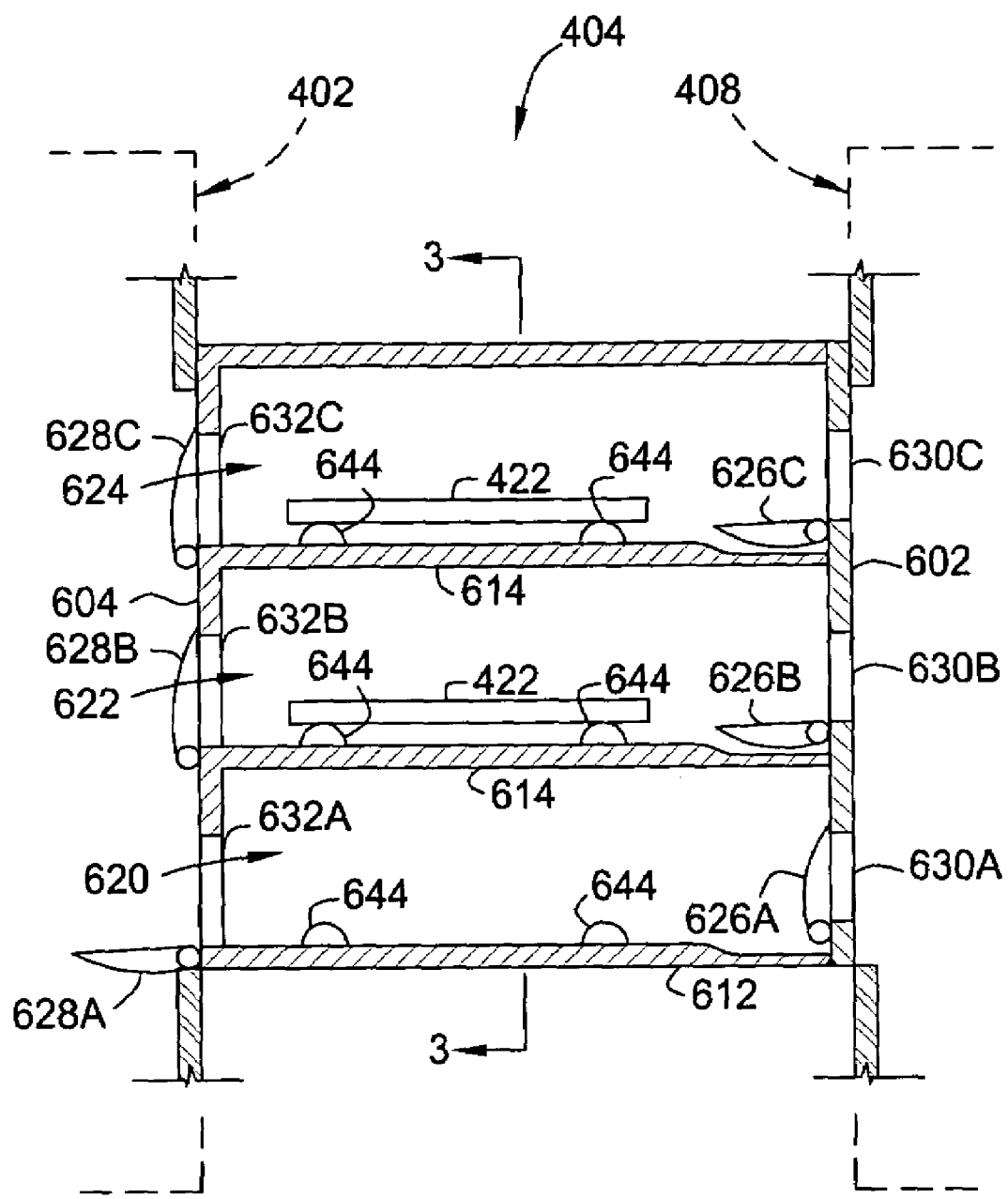
FIG. 6 is a cross-sectional view of one embodiment of a substrate loading and unloading station.

FIG. 6 is an example of one embodiment of the load lock chamber 404 of the invention. The load lock chamber 404 may include one or more vertically stacked transfer compartments/sub-chambers in order to reduce the footprint of the substrate processing systems of the invention. Each load lock sub-chamber may be configured to process a single substrate as shown in FIG. 6, or alternatively, each load lock sub-chamber may be configured for loading and unloading multiple substrates.

The load lock chamber 404 includes a chamber body 612 with a plurality of vertically-stacked, environmentally-isolated single substrate sub-chambers 620, 622, 624 separated by a plurality of vacuum-tight, horizontal interior walls 614. Two of the horizontal interior walls 614 are shown in FIG. 6. Although three single substrate transfer chambers 620, 622, 624 are shown in the embodiment depicted in FIG. 6, it is contemplated that the chamber body 612 of the load lock chamber 404 of the invention may include just one chamber or two or more vertically-stacked substrate sub-chambers. For example, the load lock chamber 404 may include N substrate sub-chambers separated by N−1 horizontal interior walls 614, where N is an integer number.

Load lock chambers that may be adapted to benefit from the invention are described in commonly assigned U.S. patent application Ser. No. 09/957,784, entitled "Double Dual Slot Load Lock for Process Equipment", filed Sep. 21, 2001 by Kurita et al. and Ser. No. 10/832,795, entitled "Load Lock Chamber for Large Area Substrate Processing System", filed Apr. 26, 2004 by Kurita et al., all of which are hereby incorporated by reference in their entireties. It is contemplated that load lock chambers of other configurations may also benefit from the invention.

In the embodiment depicted in FIG. 6, the substrate sub-chambers 620, 622, 624 are each configured to accommodate a single large area substrate, such as the substrate 422, so that the volume of each chamber may be minimized to enhance fast pumping and vent cycles. For example, each substrate sub-chamber 620, 622, 624 may be configured to support substrates therein and have an interior volume of equal to or less than about 1000 liters to accommodate substrates, each having a plan surface area of about 2.7 square meters. Alternatively, a dual slot dual substrate load lock chamber having an interior volume of about 1600 liters for supporting two substrates in each sub-chamber/slot, can also be used. It is contemplated that a substrate sub-chamber of the invention having a greater width and/or length and equal height may be configured to accommodate even larger substrates.

The chamber body 612 can be fabricated from a rigid material suitable for use under vacuum conditions, such as stainless steel, aluminum, etc. In addition, the chamber body 612 can be fabricated from a single block (e.g., one piece) of a rigid material, such as aluminum. Alternatively, the chamber body 612 or portions thereof may be fabricated from modular sections, each modular section generally comprising a portion of one of the substrate transfer chambers 620, 622, 624, and assembled in a fashion suitable to maintain vacuum integrity, such as continuous welding. In addition, the horizontal interior walls 614 of the chamber body 612 may be vacuum sealed to sidewalls of the chamber body 612, thereby isolating the substrate sub-chambers 620, 622, 624. For example, the horizontal interior walls 614 assembled into the load lock chamber 404 may be continuously welded to the chamber body 612 to allow greater access to the entire interior of the chamber body 612.

Each of the substrate sub-chambers 620, 622, 624 defined in the chamber body 612 includes two substrate access ports. For example, in FIG. 6, the first substrate sub-chamber 620 disposed at the bottom of the chamber body 612 includes a first substrate access port 630A and a second substrate access port 632A coupled to the transfer chamber 408 and the factory interface 402, respectively. The two access ports may be positioned, for example, on opposite sides of the chamber sidewalls; however, they may alternatively be positioned on adjacent walls of the body 612. The substrate access ports are configured to facilitate the entry and egress of the substrates 422 from the load lock chamber 404 and may have a width of, for example, greater than about 2000 mm, depending on the sizes of the substrates 422. Similarly, the substrate sub-chamber 622 is configured with access ports 630B, 632B and the substrate sub-chamber 624 is similarly configured with access ports 630C, 632C.

Each of the substrate access ports 630A, 630B, 630C, 632A, 632B, 632C is selectively sealed by a respective slit valve 626A, 626B, 626C, 628A, 628B, 628C adapted to selectively isolate the substrate sub-chambers 620, 622, 624 from the environments of the transfer chamber 408 and the factory interface 402. The slit valves 626A, 626B, 626C, 628A, 628B, 628C are pivotally coupled to the chamber body 612 and may be moved between an open and closed position using an actuator (not shown).

The slit valves 626A, 626B, 626C seal the substrate access ports 630A, 630B, 630C from the interior side of a first sidewall 602 and is thereby positioned within the substrate sub-chambers 620, 622, 624 such that a vacuum (e.g., pressure) differential between the substrate sub-chambers 620, 622, 624 and the vacuum environment of the transfer chamber 408 assists in loading and sealing the slit valves 626A, 626B, 626C against the sidewall of the chamber body 612, thereby enhancing the vacuum seal. Correspondingly, the slit valves 628A, 628B, 628C are disposed on the exterior side of a second sidewall 604 and are thereby positioned such that the pressure differential between the ambient environment of the factory interface 402 and the vacuum environment of the substrate sub-chambers 620, 622, 624 assists in sealing the substrate access ports 632A, 632B, 632C. Examples of the slit valves that may be adapted to benefit from the invention are described in U.S. Pat. No. 5,579,718, issued Dec. 3, 1996 to Freerks and U.S. Pat. No. 6,045,620, issued Apr. 4, 2000 to Tepman et al., both of which are hereby incorporated by reference in their entireties.

The substrate 422 is supported above the bottom of each of the substrate sub-chambers 620, 622, 624 by a plurality of substrate supports 644, which are configured and spaced at an elevation with the chamber body 612 or the horizontal interior walls 614. The substrate supports 644 may be, for example, stainless pins having a rounded upper end configured to minimize scratching and contamination of the substrates 422. Other suitable substrate supports are described in U.S. Pat. No. 6,528,767, filed Mar. 4, 2003; U.S. patent application Ser. No. 09/982,406, filed Oct. 17, 2001; and U.S. patent application Ser. No. 10/376,857, filed Feb. 27, 2003, all of which are incorporated by reference in their entireties.

Figure 7:
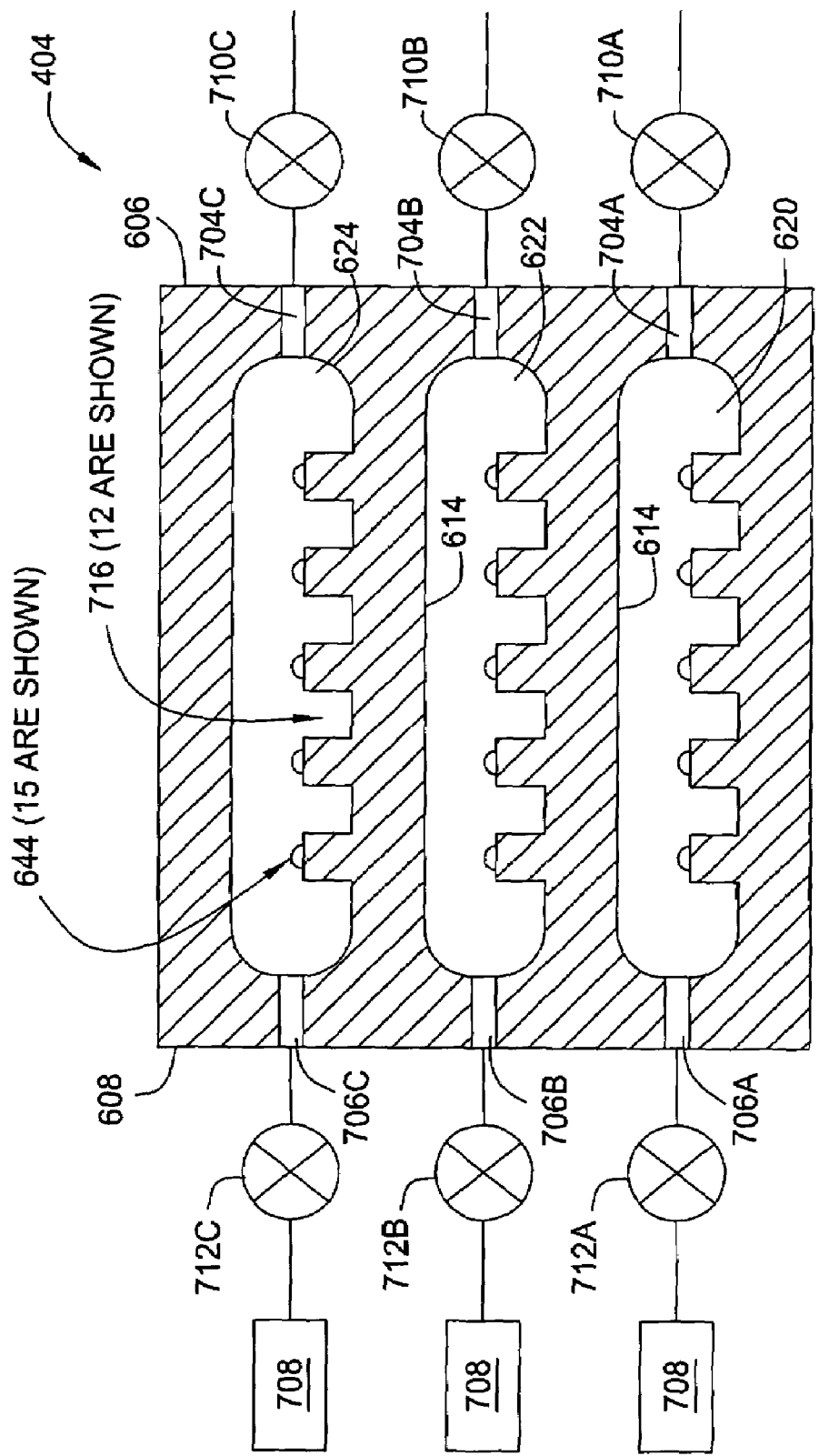
FIG. 7 is another cross-sectional view of substrate loading and unloading station according to one embodiment of the invention.

FIG. 7 is a sectional view of the load lock chamber 404 taken along section line 3-3 of FIG. 6. The sidewalls of each of the substrate sub-chambers 620, 622, 624 includes at least one port disposed therethrough to facilitate controlling the pressure within the interior volume of each chamber. For example, In the embodiment depicted in FIG. 7, the chamber body 612 includes vent ports 704A, 704B, 704C formed through a third sidewall 606 and vacuum ports 706A, 706B, 706C formed through a fourth sidewall 608 of the chamber body 612 for venting and pumping down of the substrate sub-chambers 620, 622, 624. Valves 710A, 710B, 710C, 712A, 712B, 712C are respectively coupled to the vent ports 704A, 704B, 704C and the vacuum ports 706A, 706B, 706C to selectively prevent flow therethrough. The vacuum ports 706A, 706B, 706C are coupled to one or more vacuum pumps 708. For example, one or more of the substrate sub-chambers 620, 622, 624 may share a single vacuum pump equipped with appropriate flow controls or restrictors to facilitate selective pumping between the substrate sub-chambers, or alternatively, there may be two or more vacuum pumps. The vacuum pump 708 is utilized to selectively lower the pressure within the interior volume of each of the substrate sub-chambers 620, 622, 624 to a level that substantially matches the pressure of the transfer chamber 408.

Typically, the pressure of the load lock chamber 404 is maintained by the pumping mechanism coupled thereto (e.g., the vacuum pump 708) which may include one or more pumps, such as a dry pump, a roughing pump, a turbo pump, and a cryogenic pump, among others. The pressure of the load lock chamber 404 can be kept at a range of about 5 Torr or lower, such as a range of about 3 Torr or lower, or about 500 mTorr or lower, depending on the required minimum pressure difference between the load lock chamber and the transfer chamber. Alternatively, when high vacuum base pressure of the transfer chamber is needed, the load lock chamber 404 of the invention is coupled to a cryogenic pump with high evacuation efficiency and can be kept at about $10^{-3}$ Torr or less, such as at about $10^{-4}$ Torr or less.

When the pressures between the transfer chamber 408 and the substrate sub-chambers 620, 622, 624 of the load lock chamber 404 are substantially equal or comparable, the slit valves 626A, 626B, 626C may be opened to allow substrates that has been processed to be transferred to the load lock chamber 404 and, alternatively, substrates that will be processed to be transferred to the transfer chamber 408 using the transfer robot 430 via the substrate access ports 630A, 630B, 630C. After placing the substrates 422 returning from the transfer chamber 408 onto the substrate supports 644 of the substrate sub-chambers 620, 622, 624 of the load lock chamber 404, the slit valves 626A, 626B, 628C are closed and the valves 710A, 710B, 710C can be opened, thereby allowing venting gas, for example, $N_2$ and/or He, etc., flowing into the substrate sub-chambers 620, 622, 624 of the load lock chamber 404 through the vent ports 704A, 704B, 704C and raising the pressure within the internal volume of the substrate sub-chamber 620, 622, 624. Typically, venting gas entering the interior volume via the vent ports 704A, 704B, 704C is filtered to minimize potential particulate contamination of the substrate 422. Maintaining the vacuum pressure level and venting within the substrate sub-chambers 620, 622, 624 can be performed individually on each of the substrate sub-chambers 620, 622, 624. Once the pressure within each of the substrate sub-chambers 620, 622, 624 is substantially equal to that of the factory interface 402, the slit valves 628A, 628B, 628C open, thus allowing the atmospheric robot from the factory interface 402 to transfer substrates between the sub-strate sub-chamber 620, 622, 624 and the substrate storage cassettes coupled to the factory interface 402 through the substrate access port 632A, 632B, 632C.

As the substrate sub-chambers 620, 622, 624 are configured to be compact, for example, with less than or equal to about 1000 liters of volume for a substrate size of greater than 3 square meters, the load lock chambers 404 may transfer about 70 substrates per hour at a reduced pumping rate as compared to a conventional load lock chamber, which has a substrate transfer rate of about 60 substrates per hour. A reduced pumping rate of between about 160-180 seconds per pump/vent cycles can be obtained. Other load lock chamber having a reduced pumping rate of about 130 seconds per cycle can also be used. The substantially longer cycle reduces air velocity within the load lock chamber 404, thereby reducing the probability of particular contamination of the substrate, while eliminating the condensation. Furthermore, the exemplary stacked configuration of the substrate sub-chambers improves substrate processing throughput without increasing the footprint of the load lock chamber, highly desirable in reducing the overall cost of a fabrication facility. Additionally, the overall height of the load lock chamber having three single substrate sub-chambers is less than the height of conventional load lock chamber, further providing greater throughput in a smaller, less expensive package. Moreover, greater substrate throughput can be achieved using other suitable pumps having lower capacity, which contributes to reducing the costs.

In FIG. 7, the bottom of the chamber body 612 and the horizontal interior walls 614 may also include one or more grooves 716 formed therein and configured to provide clearance between the substrate 422 disposed on the substrate supports 644 and the transfer robot 430. The blades or fingers of the transfer robot 430 can be moved into the grooves 716 to a predefined position within the substrate sub-chamber, the blades are elevated to lift the substrate 422 from the substrate supports 644. The blade carrying the substrate 422 is then retracted from the substrate sub-chamber. The substrate 422 can be placed onto the substrate supports 644 in a reverse manner.

The load lock chamber 404 provides a good buffer station for flowing the substrate 422 in a specific timely manner as may be needed during an in-situ integrated fabrication sequence to deposit a multi-layer film stack on the substrate 422. The load lock chambers 404 may also be used to perform additional substrate preparation or treatment steps on the substrate 422, such as heating, cooling, among others, while the substrate 422 is flown from the factory interface 402 into and out of the substrate processing systems of the invention.

In one embodiment, at least one of the substrate sub-chambers 620, 622, 624 of the load lock chamber 404 is adapted to rapidly heat and cool the substrate 422 when positioned on the substrate support 644. Detail of the heating and cooling capability of the load lock chamber 404 is described in commonly assigned U.S. Pat. Nos. 6,086,362; 6,193,507; and 6,435,868, titled "Multi-Function Chamber for a Substrate Processing System; and in co-pending United States Patent Applications (docket number: AMAT/10200) titled "Load Lock Chamber with Substrate Temperature Regulation" by Hosokawa et al.; and docket number: AMAT/10201) titled "Method and Apparatus for Substrate Temperature Control Utilizing Gas Delivered" by Le et al., all of which are incorporated by reference in their entirety.

Referring back to FIGS. 3A-5, one embodiment of the invention provides that at least one of the substrate sub-chambers 620, 622, 624 of the load lock chamber 404 is adapted to pre-heat the substrate 422 before loading into the process chambers 410, 412, 414, 418, 420 and there is no separate pre-heat chamber to be coupled to the substrate processing systems of the invention. For example, the substrate 422 to be processed may be pre-heated to a temperature of about 80° C. or more, or close to a desired process temperature for the process chambers, such as about 100° C. or more, such that the substrate can be loaded onto the process chambers to be processed immediately. For example, the substrate 422 can be pre-heated inside the load lock chamber 404 to about 120° C. for a processing temperature of between about 100° C. to about 120° C. inside the process chambers 410, 412, 414, 418, 420. Accordingly, there is no waiting for the temperature of the process chambers to be reached to the desired temperature, especially when two or more designated process chambers are used for a single substrate processing sequence, and the substrate processing throughput can be improved dramatically.

In FIGS. 3A-5, the transfer chamber 408 is adapted to transfer substrates between a plurality of process chambers 410, 412, 414, 418, 420 and one or more load lock chambers 404 such that the transfer chamber 408 is surrounded by one or more process chambers 410, 412, 414, 418, 420 and one or more load lock chambers 404. The transfer chamber 408 is maintained at a vacuum condition to eliminate or minimize pressure differences between the transfer chamber 408 and the individual process chambers 410, 412, 414, 418, 420 after each substrate transfer.

Figure 8:
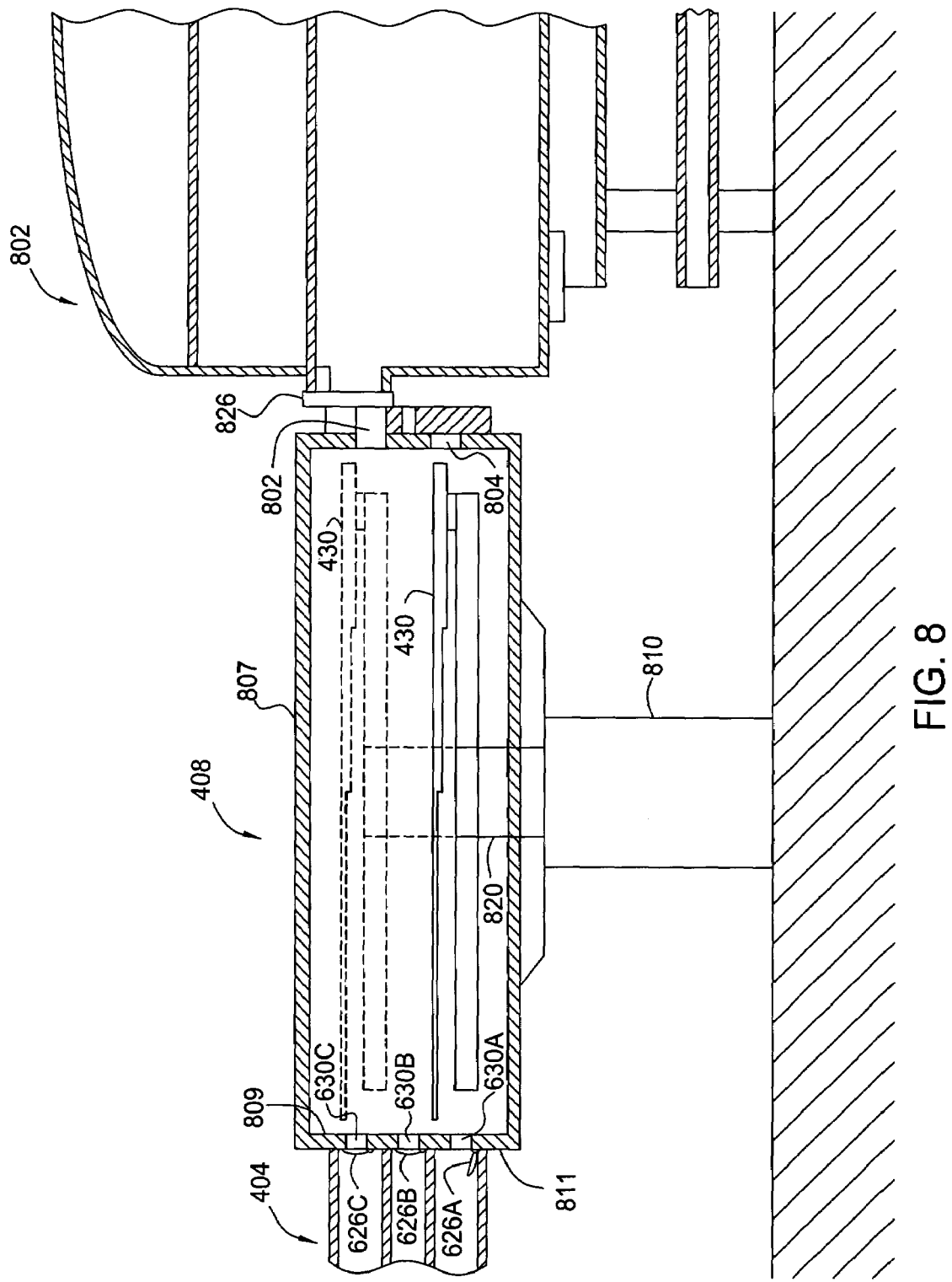
FIG. 8 is a cross-sectional view of one exemplary substrate transfer station having an exemplary robot assembly therein according to one embodiment of the invention.

FIG. 8 is a sectional view of one embodiment of the transfer chamber 408 of the invention. A transfer robot 430, such as a dual arm vacuum robot available from Applied Materials, Inc., can be coupled to the transfer chamber 408 for moving the substrate 422. The transfer chamber 408 may be coupled to a load lock chamber, which may be, for example, a triple single substrate load lock (TSSL), a double dual slot load lock (DDSL), or other conventional load lock. The transfer chamber 408 may also be coupled to at least one process chamber and/or other additional load lock chambers, buffer stations, substrate transfer shuttle chambers, and shuttle mechanisms, such as the process chambers 410, 412, 414, 418, 420 and the load lock chamber 404 of the invention.

A shown in FIG. 8, the transfer chamber 408 includes a main body 807 configured to be positioned above a base 810. The main body 807 may have an interior wall 809 and an exterior wall 811. The shape of the interior wall 809 may be cylindrical in shape, or other shape, and the exterior wall 811 may be hexagonal or other shapes and may include flat regions which form side walls that are adapted to couple to the process chambers or load lock chambers of the invention. The main body 807 may be, for example, machined from a single piece of a material, such as stainless steel, aluminum, among others. The height of the main body 807 is minimized so as to reduce the overall volume and weight of the transfer chamber 408.

Each side wall may include one or more openings coupled to one or more valves, such as the slit valves 626A, 626B, 626C, through which the substrate 422 (not shown) may be transferred from the transfer chamber 408 to a load lock chamber, or vice versa, using the transfer robot 430. Other side wall may include one or more openings 802, 804. For example, the opening 802 may be coupled to a process chamber, for example, the process chamber 418 as shown in FIG. 8, via a valve 826. The valve 826 may be a conventional gate valve, a slit valve, or other conventional valves. The valve 826 may selectively open and close the opening 802 from the interior or exterior side of the side wall of the transfer chamber 408 using an actuator (not shown) associated therewith. In addition, the opening 804 may be used to coupled to a pumping mechanism (not shown) to pump down the pressure level of the transfer chamber 408 to a suitable degree of vacuum.

A shaft 820 and a lift mechanism may be coupled to the transfer robot 430 and the base 810 of the transfer chamber 408 to provide rotational movement and vertical movement of the transfer robot 430. The rotational movement of the transfer robot 430 may be required for moving the substrates 422 among the different chambers coupled to the transfer chamber 408 and the vertical movement of the transfer robot 430 may be required for moving the substrates 422 vertically to a position to be aligned to the different access ports and/or openings on the side walls of the various chambers of the invention.

The pressure of the transfer chamber 408 is maintained by the pumping mechanism coupled thereto, which may include one or more pumps, such as a dry pump, a roughing pump, a turbo pump, and a cryogenic pump, among others. The pressure of the transfer chamber 408 can be kept at a range of about 5 Torr or lower, such as a range of about 1 Torr or lower, or even about $10^{-3}$ Torr or less, depending on the required minimum pressure difference between the process chambers and the transfer chamber.

One embodiment of the invention provides the transfer chamber being coupled to a cryogenic pump with high evacuation efficiency to obtain high vacuum base pressure of the transfer chamber compatible for the high vacuum requirement of a PVD process and the transfer chamber 408 can be kept at a base pressure of about $10^{-4}$ Torr or less, such as at about $10^{-5}$ Torr to about $10^{-6}$ Torr.

Additional transfer chambers that may be adapted to benefit from the invention are described in commonly assigned U.S. Pat. No. 6,786,935, filed Mar. 10, 2000, entitled "Vacuum Processing System for Producing Components", by Powell; and U.S. patent application Ser. No. 10/601,185, filed Jun. 20, 2003, entitled "Transfer Chamber for Vacuum Processing System", by kurita et al., which are hereby incorporated by reference in their entireties.

Referring back to FIGS. 3A-5, according to one aspect of the invention, the substrate processing systems 300A, 300B, 400, 500 generally include a first PVD chamber 410 and a second PVD chamber 412. In one embodiment, the first PVD chamber 410 is configured to support substrate processing of a first metal material layer as described in the method 200 of FIG. 2 and the second PVD chamber 412 is configured to support substrate processing of a different metal material layer without the need to change to different targets or lid assemblies, which are generally large in dimension and thus very heavy in weight for flat panel display applications. The invention contemplates coupling other process chambers to the substrate processing systems 300A, 300B, 400, 500, such as additional PVD chamber, ion metal implant (IMP), CVD, atomic layer deposition (ALD), plasma etching, annealing, cleaning, and other furnace chambers, etc.

The invention provides the use of the first PVD chamber 410 and the second PVD chamber 412 in a single substrate processing system to greatly enhance the throughput of the substrate processing system 300A, 300B, 400, 500 and reduce the numbers of cluster tools required. For example, the TACT time for the substrate processing systems 300A, 300B, 400, 500 of the inventions can be improved to about 25 substrates per hour or larger for a three-layer deposition process, such as about 35 substrates per hour or larger or even about 40 substrates per hour or larger for a two-layer deposition process, or about 60 substrates per hour for a single-layer deposition process. Accordingly, the transfer chamber 408 is rotably movable among the load lock chamber 404, the first PVD chamber 410, the second PVD chamber 412, and other additional chambers, such as a third PVD chamber 414, other process chamber 418, 420, etching chambers, ashing chambers, ion implant chambers, heating chambers, among others, coupled thereto for performing additional processes on the substrate 422 after being processed by the second PVD chamber 412.

The first PVD chamber 410 of the substrate processing systems 300A, 300B, 400, 500 is coupled to the transfer chamber 408 to receive the substrate 422 being loaded into the first PVD chamber 410 from the load lock chamber 404 for depositing a first metal material layer on the substrate 422. In addition, the substrate 422 can be transferred in between the first PVD chamber 410 and the second PVD chamber 412 using the transfer chamber 408. The substrate 422 can be transferred to the second PVD chamber 412 for depositing a second metal material layer on the substrate 422 without breaking vacuum or exposing to atmospheric environment.

As shown in FIG. 3A, the first PVD chamber is conveniently positioned to be close to the load lock chamber 404 for depositing a first metal material layer on the substrate 422. Alternatively, the substrate 422 can be first loaded to the second PVD chamber 412 positioned further away from the load lock chamber 404 for depositing a first metal material layer on the substrate 422 and then transferred to the first PVD chamber 410 for depositing a second metal material layer.

The thicknesses of the first metal material layer and the second metal material layer are not limited and can range between about 10 angstroms to about 10000 angstroms. One embodiment of the invention provides the first metal material layer deposited by the first PVD chamber 410 is thinner in thickness than the second metal material deposited by the second PVD chamber 412 for depositing a two-layer film stack on the substrate 422. Accordingly, the throughput of the substrate processing systems of the invention for a two-layer deposition process is improved to be at least about 35 substrates per hour, such as at least about 40 substrates per hour.

In another embodiment, the first PVD chamber 410 and the second PVD chamber 412 of the substrate processing systems of the invention are designated to process a three-layer deposition process where two thin layers of a first metal material is used to sandwich a thicker layer of a second metal material. In general, a thicker film/layer takes longer time to deposit. Accordingly, one or more substrates can be processed at a very high throughput to sequentially deposit a thin first metal material layer using the first PVD chamber 410, a thick second metal material layer using the second PVD chamber 412, and a thin first metal material layer over the thick second metal material layer by transferring the substrate back to the first PVD chamber 410. Accordingly, the throughput of the substrate processing systems for such a three-layer film stack can be improved to be at least about 25 substrates per hour, such as at least about 30 substrates per hour, using only two designated process chambers, and there is less idle time for the first PVD chamber 410 and second PVD chamber 412.

Figure 3B:
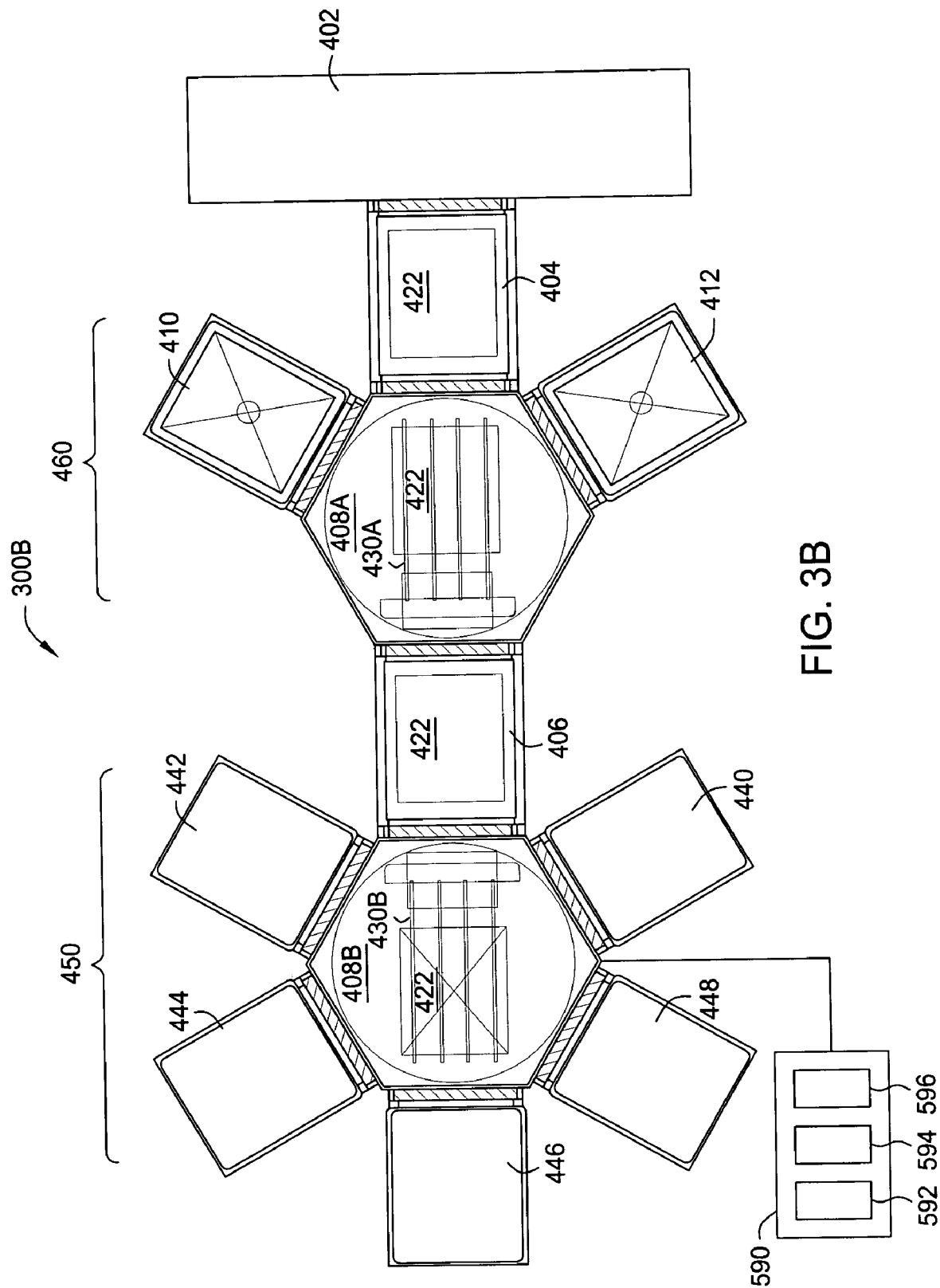
FIG. 3B is a plan view of another exemplary cluster tool configured for in-situ processing of a film stack according to another embodiment of the invention.

FIG. 3B illustrates an exemplary hybrid cluster tool, the substrate processing system 300B, configured to include two or more types of process chambers. The substrate processing system 300B generally includes the first PVD chamber 410 and the second PVD chamber 412 in a process module 460, each PVD chamber being designated to deposit different material layers on the substrate 422 without the need to change the target. The first PVD chamber 410 and the second PVD chamber 412 of the process module 460 are coupled to a first transfer chamber 408A having a first transfer robot 430A therein. The process module 460 is also coupled to another process module 450, which may include other types of process chambers coupled thereto, such as one or more process chambers 440, 442, 444, 446, 448 coupled to the process module 460 through the use of a second load lock chamber 406. For example, the process chambers 440, 442, 444, 446, 448 may each be configured into chemical vapor deposition chambers, plasma enhanced chemical vapor deposition chambers, or other thermal chambers. The process chambers 440, 442, 444, 446, 448 may be coupled to a second transfer chamber 408B having a second transfer robot 430B therein.

Figure 4:
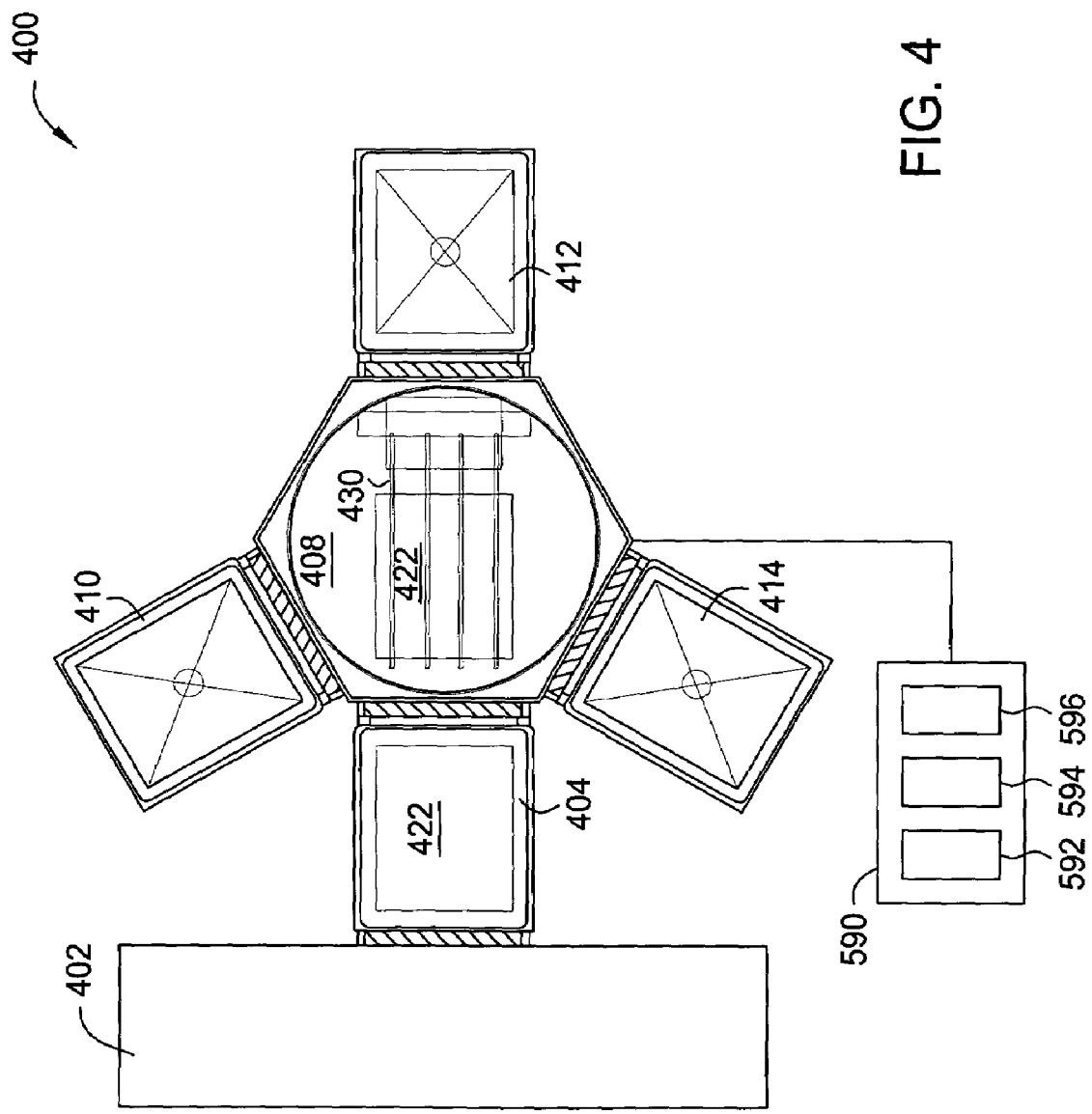
FIG. 4 is a plan view of an exemplary cluster tool configured for in-situ processing of a film stack according to another embodiment of the invention.
Figure 5:
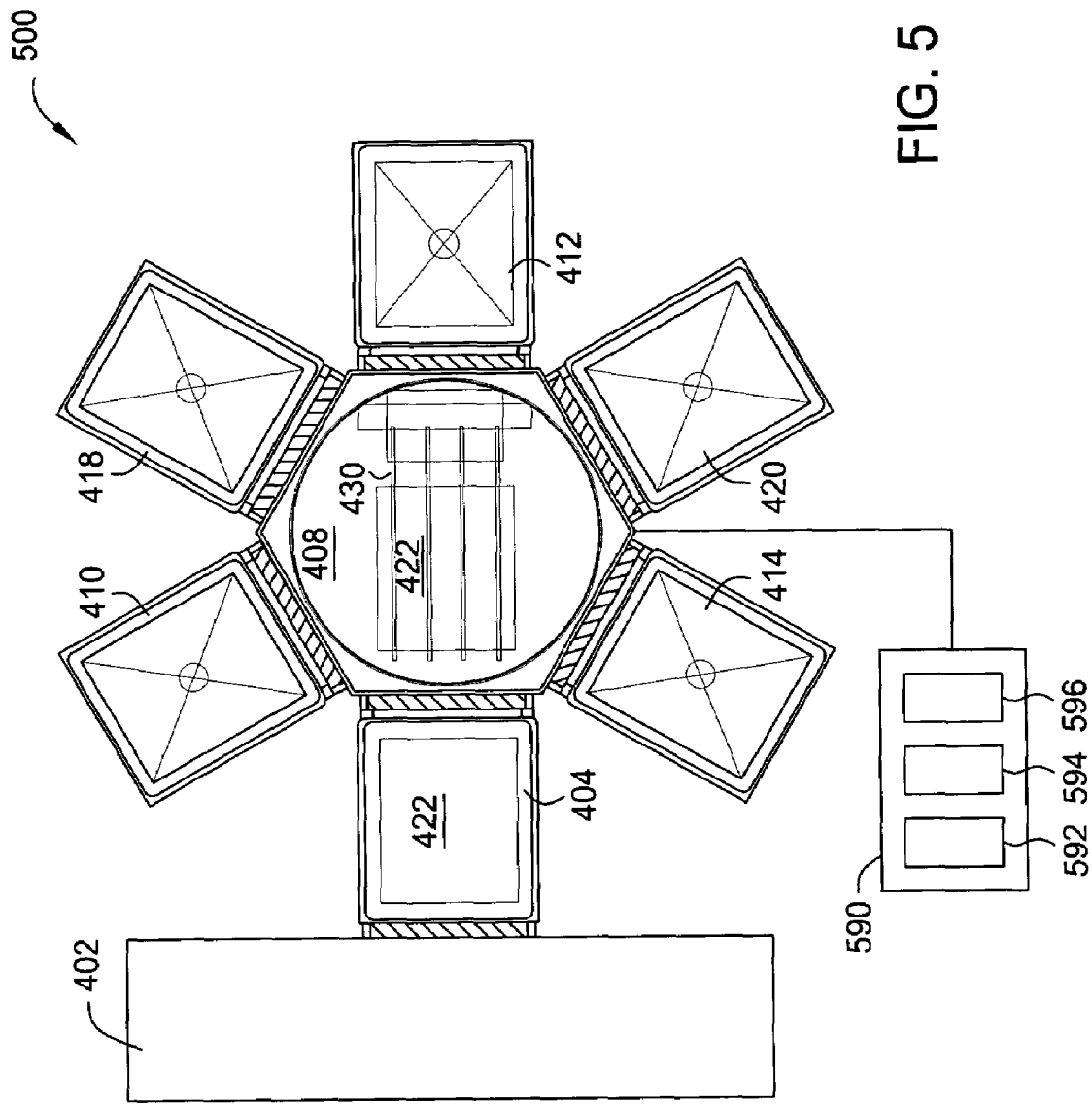
FIG. 5 is a plan view of an exemplary cluster tool configured for in-situ processing of a film stack according to still another embodiment of the invention.

As shown in FIGS. 4 and 5, the substrate processing system 400 may also include the third PVD chamber 414 configured to receive the substrate 422 from the second PVD chamber 412, using the transfer chamber 408 coupled thereto, for deposition of a third material layer over the second metal material layer on the surface of the substrate. Thus, there is no second transfer chamber needed in order to reduce the footprint of the substrate processing systems. The throughput of the substrate processing system of the invention for processing different material layers on multiple substrates is improved by a specific software-controlled substrate flow sequence using a controller 590.

In another embodiment of the invention, the third PVD chamber 414 can be designated to deposit either the first metal material layer or the second metal material layer, whichever layer that takes longer time to deposit, by coupling the third PVD chamber 414 to a target comprising the appropriate metal material for sputtering. This is convenient for processing multiple substrates and increased substrate throughput is desired. For example, the third PVD chamber 414 may be used to deposit a thicker film, which generally takes longer time to deposit. Therefore, the first, second and third PVD chambers 410, 412, 414 of the invention can be designated into one chamber for a thinner material layer and two chambers for a thicker material layer. Accordingly, the throughput of three designated PVD chambers for a two-layer deposition process is improved to be at least about 40 substrates per hour, such as at least about 50 substrates per hour.

Accordingly, two or more designated PVD chambers can be used in the substrate processing systems 300A, 300B, 400, 500 to deposit two or more metal material layers on the substrate 422 using the controller 590 to execute a software-controlled multi-substrate processing sequence. In FIG. 5, the substrate processing system 500 may include the first PVD chamber 410, the second PVD chamber 412, the third PVD chamber 414, and additional chambers 418, 420.

Figure 9:
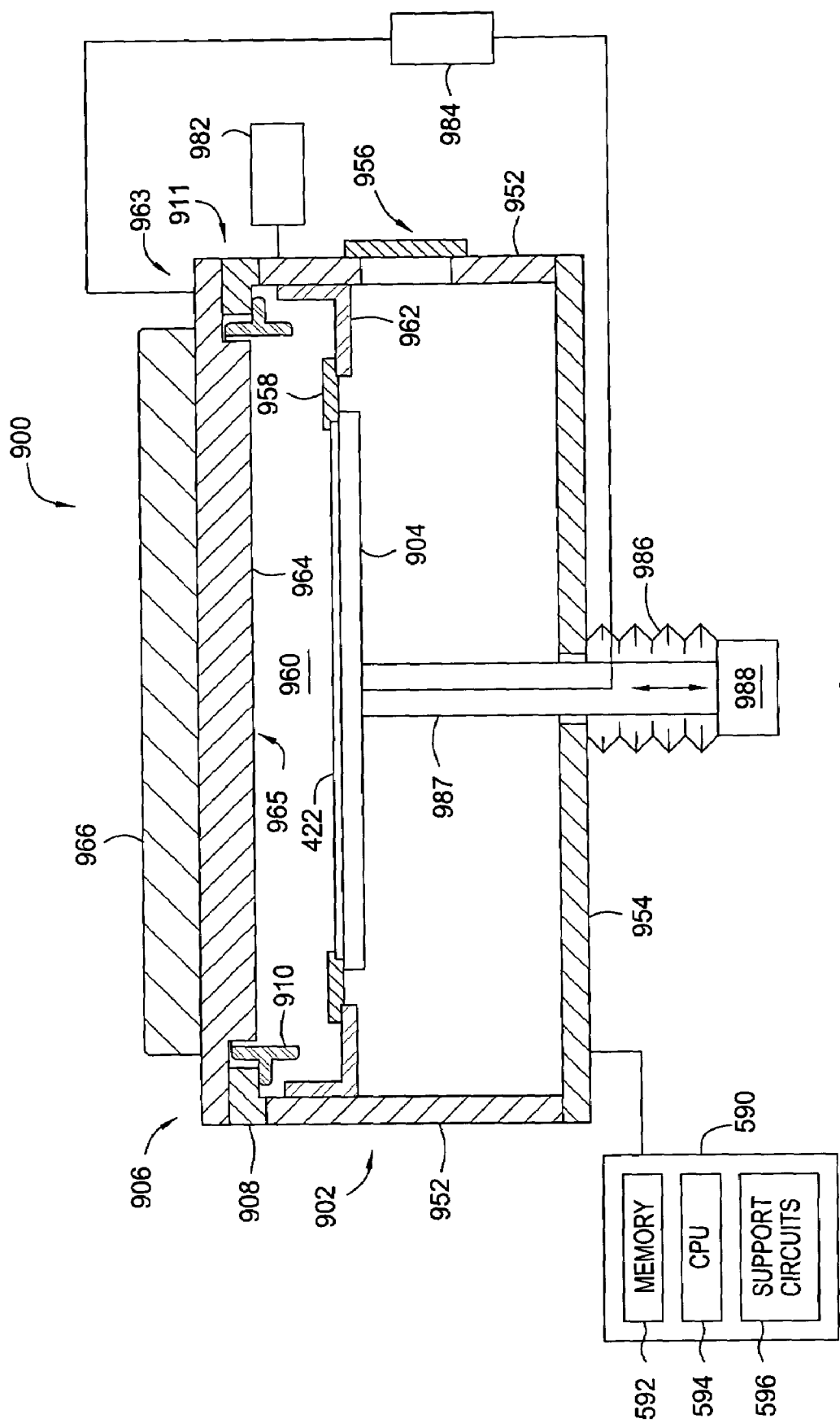
FIG. 9 illustrates a sectional view of one exemplary physical vapor deposition (PVD) chamber that may be used in connection with one or more embodiments of the invention.

FIG. 9 illustrates an exemplary process chamber 900 according to one embodiment of the invention. One example of the process chamber 900 that may be adapted to benefit from the invention is a physical vapor deposition (PVD) process chamber, available from AKT, a division of Applied Materials, Inc., located in Santa Clara, Calif. The process chamber 900 can be configured into the first PVD chamber 410, the second PVD chamber 412, the third PVD chamber 414, and any of the additional chambers 418, 420.

The process chamber 900 includes a chamber body 902 and a lid assembly 906, defining a process volume 960. The chamber body 902 is typically fabricated from a unitary block of aluminum or welded stainless steel plates. The chamber body 902 generally includes sidewalls 952 and a bottom 954. The sidewalls 952 and/or bottom 954 generally include a plurality of apertures, such as an access port 956 and a pumping port (not shown). The pumping port is coupled to a pumping device (also not shown) that evacuates and controls the pressure within the process volume 960. The pumping device is able to maintain the pressure of the process chamber 900, such as the process chambers 418, 420, to a high vacuum level. For example, the pressure level of the process chambers 418, 420 can be maintained to about 1 Torr or less, such as at about $10^{-3}$ Torr or less, at about $10^{-5}$ Torr to about $10^{-7}$ Torr, or at about $10^{-7}$ Torr or less.

The access port 956 is sealable, such as by a slit valve or other vacuum sealable assembly, and may be coupled to the transfer chamber 408 and other chambers of the substrate processing system of the invention to provide entrance and egress of the substrate 422 (e.g., a flat panel display substrate or a semiconductor wafer) into and out of the process chamber 900. Other apertures, such as a shutter disk port (not shown) may also optionally be formed on the sidewalls 952 and/or bottom 954 of the chamber body 902.

The dimensions of the chamber body 902 and related components of the process chamber 900 are not limited and generally are proportionally larger than the size and dimension of the substrate 422 to be processed in the process chamber 900. For example, when processing a large area square substrate having a width of about 370 mm to about 2160 mm and a length of about 470 mm to about 2460 mm, the chamber body 902 may include a width of about 570 mm to about 2360 mm and a length of about 570 mm to about 2660 mm. As one example, when processing a substrate size of about 1000 mm×1200 mm, the chamber body 902 can have a cross sectional dimension of about 1750 mm×1950 mm. As another example, when processing a substrate size of about 1950 mm×2250 mm, the chamber body 902 can have a cross sectional dimension of about 2700 mm×3000 mm.

The lid assembly 906 generally includes a target 964 and a ground shield assembly 911 coupled thereto. The target 964 provides a material source that can be deposited onto the surface of the substrate 422 during a PVD process. The target 964 or target plate may be fabricated of a material that will become the deposition species or it may contain a coating of the deposition species. To facilitate sputtering, a high voltage power supply, such as a power source 984 is connected to the target 964.

The target 964 generally includes a peripheral portion 963 and a central portion 965. The peripheral portion 963 is disposed over the sidewalls 952 of the chamber. The central portion 965 of the target 964 may protrude, or extend in a direction towards a substrate support 904. It is contemplated that other target configurations may be utilized as well. For example, the target 964 may comprise a backing plate having a central portion of a desired material bonded or attached thereto. The target material may also comprise adjacent tiles or segments of material that together form the target.

Figure 10:
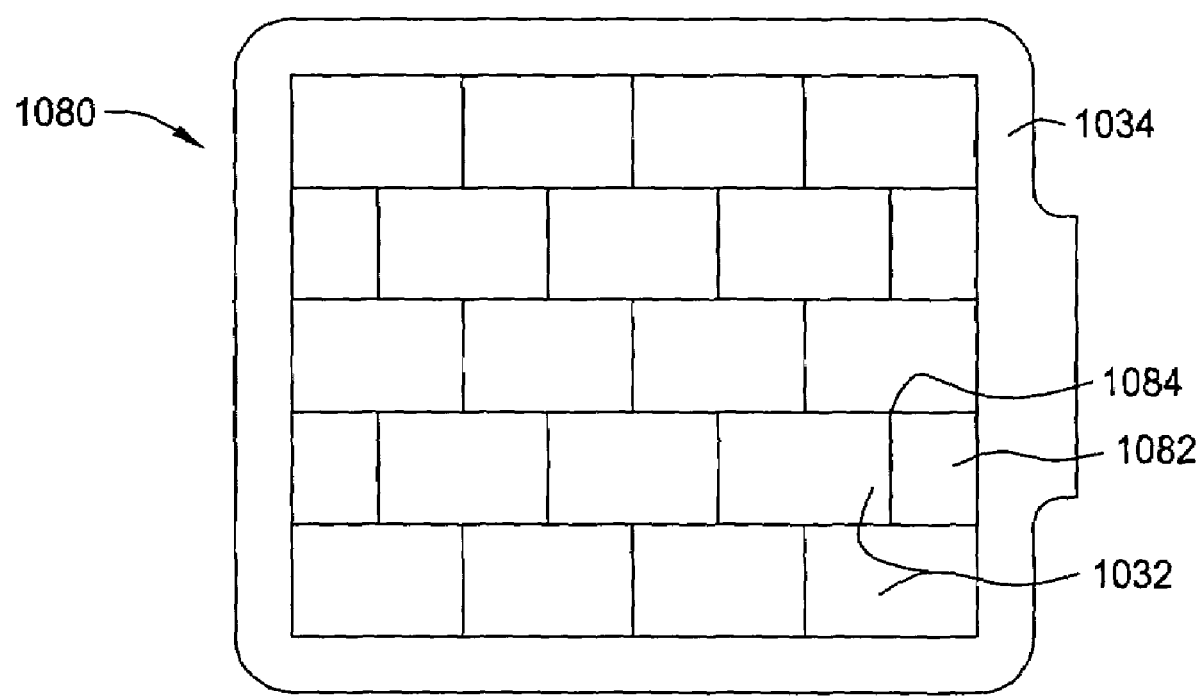
FIG. 10 illustrates a sectional view of one exemplary target that may be used in connection with one or more embodiments of the invention.

FIG. 10 illustrates an exemplary embodiment of a target 1080 of the invention, including tiles 1032, such as in a rectangular shape as exemplarily illustrated, bonded to a target backing plate 1034. Each tile 1032 is of substantially the same composition at least on its sputtering face and arranged in staggered rows. In this embodiment, the tiles 1032 of one row are offset in the row direction from the tiles 1032 of the neighboring rows. In some of the rows, end tiles 1082 have a length in the row direction that is only a fraction of the corresponding full length of tiles 1032. For example, the length of the end tiles 1082 may be one-half the full length less the desired size of the gap between the tiles so that only two sizes of the tiles 1032, 1082 are needed. While the tiles 1032, 1082 can still slide in the row direction during their transfer to and bonding with the backing plate 1034, movement in the perpendicular direction is quite limited. As a result, interstices 1084 or gaps at the corners between the tiles 1032, 1082 are much less likely to grow to abnormally large sizes. Furthermore, each interstice 1084 forms between three tiles 1032, 1082 and only two of the tiles 1032, 1082 present acute angles to the interstice 1084. The target 1080 may include some rows containing a number N of whole tiles 1032 alternating with rows containing N−1 whole tiles 1032 and two half tiles 1082. Within a factor that is a ratio of the number of rows and number of columns, the aspect ratio of the whole tiles 1032 determines the aspect ratio of the useful target area covered by the tiles 1032, 1082.

Additional target configurations can also be adapted to the substrate processing systems of the invention. For examples, the tiles can be in any other shapes, such as squares, and arranged in a parallelogram arrangement similarly to the tiles 1032 or arranged in a herringbone arrangement, alternatively called a zig-zag arrangement, among other shapes and arrangements. Target configurations for a PVD chamber that may be adapted to benefit from the invention are described in co-pending U.S. patent application Ser. No. 10/888,383 filed on Jul. 9, 2004, titled "Staggered Target Titles" by Tepman; filed on May 24, 2005, titled "Multiple Target Tiles with Complementary Beveled Edges Forming a Slanted Gap Therebetween" by Hosokawa et al.; Ser. No. 11/146,763, filed on Jun. 6, 2005, titled "Bonding of Target Tile to Backing Plate with Patterned Bonding Agent" by Hosokawa et al.; titled "Elastomer Bonding of Target Tiles" by Le et al.; and filed on Jun. 13, 2005, titled "Electronic Beam Welding of Sputtering Target Tiles" by Hosokawa et al., all of which are hereby incorporated by reference in their entireties.

Optionally, the lid assembly 906 may further comprise a magnetron assembly 966, which enhances consumption of the target material during processing. Examples of the magnetron assembly include a linear magnetron, a serpentine magnetron, a spiral magnetron, a double-digitated magnetron, a rectangularized spiral magnetron, among others.

Figure 11:
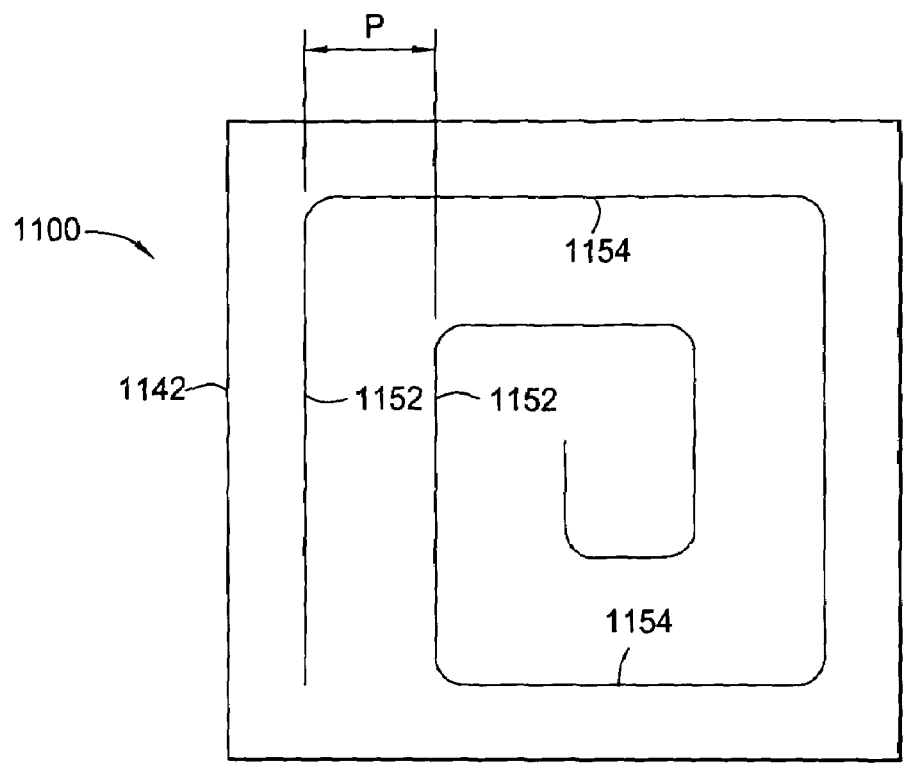
FIG. 11 illustrates a sectional view of one exemplary magnetron that may be used in connection with one or more embodiments of the invention.
Figure 12:
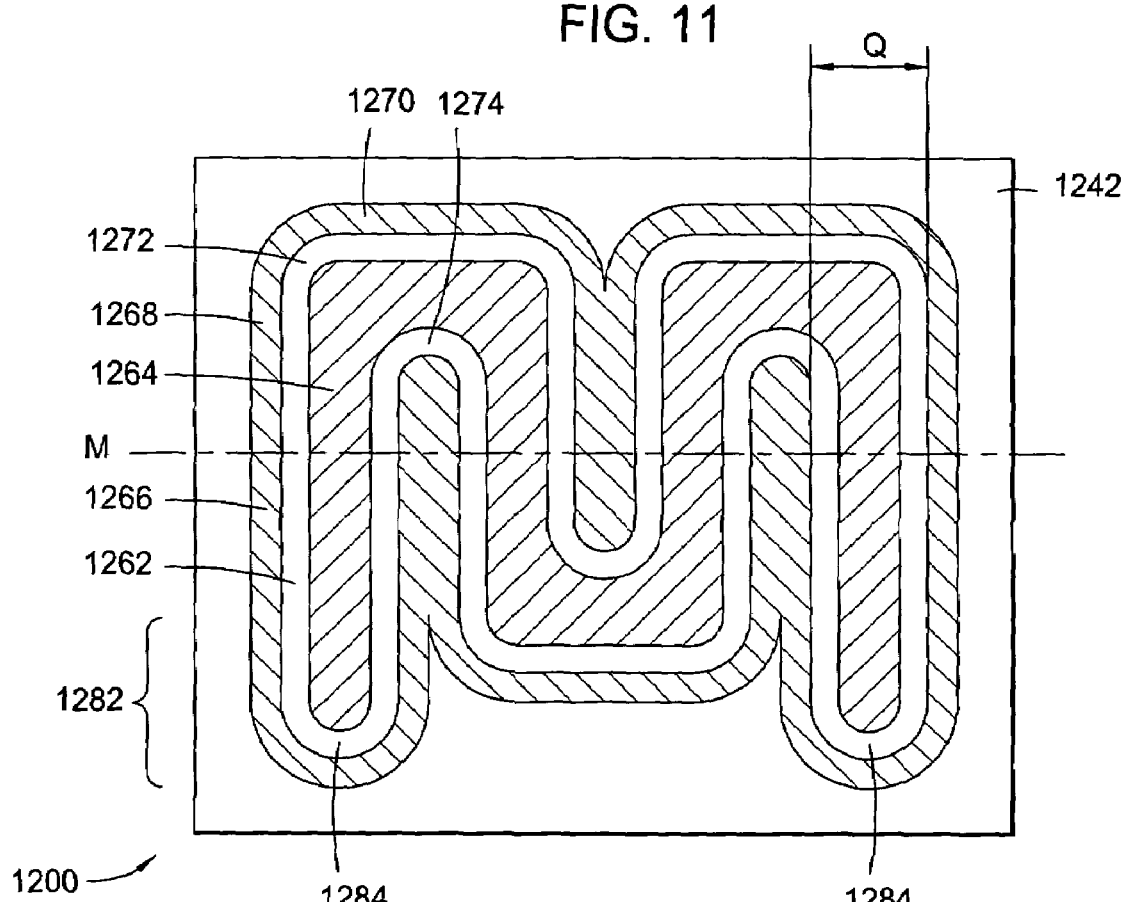
FIG. 12 illustrates a sectional view of another exemplary magnetron that may be used in connection with one or more embodiments of the invention.

FIGS. 11 and 12 illustrate two exemplary embodiments of a magnetron 1100 and magnetron 1200 that may be used in connection with one or more embodiments of the invention. The magnetron 1100 in FIG. 11 is an exemplary spiral magnetron, having a magnetron plate 1142 which may include a continuous series of straight portions 1152 and 1154 extending along perpendicular axes and smoothly joined together in a rectangular spiral. Neighboring parallel straight portions 1152 or 1154 are separated by a track pitch P. The number of folds in the magnetron 1100 may be significantly increased with a plasma loop formed between the inner pole and the surrounding outer pole.

FIG. 12 illustrates a magnetron 1200 as an exemplary serpentine magnetron that may be used in connection with one or more embodiments of the invention. The magnetron 1200 may be formed of a closed serpentine gap 1262 between an inner pole 1264 and an outer pole 1266 completely surrounding the inner pole 1264. The plasma loop includes two closely spaced anti-parallel propagating plasma tracks separated by a track pitch Q and folded to form a structure that is generally periodic in the illustrated x-direction with a period of the track pitch Q. The single folded track and hence the magnetron 1200 have a shape generally following long straight portions 1268 extending symmetrically in one direction about a medial line M and shorter straight portions 1270 extending in the other directions. Curved portions 1272, 1274, connect the straight portions 1268, 1270. The inner curved portion 1274 curves sharply around 180°. It is understood that the magnetron 1200 may include additional folds of the plasma loop, particularly for larger target sizes. The magnetron 1200 may also include tail portions 1282 in which both the inner and outer poles 1264, 1266 have been extended in the region surrounding end curved portions 1284 of the gap 1272 so that the end curved portions 1284 are outside of a rectangular outline of the useful area of the magnetron 1200. It is understood that if the plasma loop has an odd number of folds, the two tail portions 1282 occur on opposed lateral sides of the magnetron plate 1242.

Other convolute shapes for the magnetron may be used in connection with one or more embodiments of the invention. For example, serpentine and spiral magnetrons can be combined in different ways. A spiral magnetron may be joined to a serpentine magnetron, both being formed with a single plasma loop. Two spiral magnetrons may be joined together, for example, with opposite twists. Two spiral magnetrons may bracket a serpentine magnetron. Additional magnetrons that may be adapted to benefit from the invention are described in Additional PVD chambers, targets, and magnetrons that may be adapted to benefit from the invention are described in co-pending U.S. patent application Ser. No. 10/863,152, filed on Jun. 7, 2004, titled "Two Dimensional Magnetron Scanning for Flat Panel Sputtering" by Tepman; Ser. No. 11/146,762, filed on Jun. 6, 2005, entitled "Multiple, Scanning Magnetrons" by Le et al.; Ser. No. 11/167,520, filed on Jun. 27, 2005, entitled "Method for Adjusting Electromagnetic Field across a Front Side of a Sputtering Target Disposed Inside a Chamber" by Le et al.; and entitled "Evacuable Magnetron Chamber" by Inagawa et al., all of which are hereby incorporated by reference in their entireties.

Referring back to FIG. 9, during a sputtering process to deposit a material on the substrate 422, the target 964 and the substrate support 904 are biased relative each other by the power source 984. A process gas, such as inert gas and other gases, e.g., argon, and nitrogen, is supplied to the process volume 960 from a gas source 982 through one or more apertures (not shown), typically formed in the sidewalls 952 of the process chamber 900. The process gas is ignited into a plasma and ions within the plasma are accelerated toward the target 964 to cause target material being dislodged from the target 964 into particles. The dislodged material or particles are attracted towards the substrate 422 through the applied bias, depositing a film of material onto the substrate 422.

The ground shield assembly 911 includes a ground frame 908, a ground shield 910, or any chamber shield member, target shield member, dark space shield, dark space shield frame, etc. The ground shield 910 surrounds the central portion 965 of the target 964 to define a processing region within the process volume 960 and is coupled to the peripheral portion 963 of the target 964 by the ground frame 908. The ground frame 908 electrically insulates the ground shield 910 from the target 964 while providing a ground path to the chamber body 902 of the process chamber 900 (typically through the sidewalls 952). The ground shield 910 constrains the plasma within the region circumscribed by the ground shield 910 to ensure that target source material is only dislodged from the central portion 965 of the target 964. The ground shield 910 may also facilitate depositing the dislodged target source material mainly on the substrate 422. This maximizes the efficient use of the target material as well as protects other regions of the chamber body 902 from deposition or attack from the dislodged species or from the plasma, thereby enhancing chamber longevity and reducing the downtime and cost required to clean or otherwise maintain the chamber. Another benefit derived from the use of the ground frame 908 surrounding the ground shield 910 is the reduction of particles that may become dislodged from the chamber body 902 (for example, due to flaking of deposited films or attack of the chamber body 902 from the plasma) and re-deposited upon the surface of the substrate 422, thereby improving product quality and yield. The ground shield 910 may be formed of one or more work-piece fragments and/or one or more corner pieces, and a number of these pieces are bonded together, using bonding processes known in the art, such as welding, gluing, high pressure compression, etc.

The substrate support 904 is generally disposed on the bottom 954 of the chamber body 902 and supports the substrate 422 thereupon during substrate processing within the process chamber 900. The substrate support 904 may include a plate-like body for supporting the substrate 422 and any additional assembly for retaining and positioning the substrate 422, for example, an electrostatic chuck and other positioning means. The substrate support 904 may include one or more electrodes and/or heating elements imbedded within the plate-like body support.

The temperature of the substrate 422 to be processed can thus be maintained to about 500° C. or less, such as at about 200° C. or less. In one embodiment, in-situ processing of the substrate 422 can be performed by transferring the substrate 422 from one process chamber to another process chamber within the same substrate processing system of the invention without breaking the vacuum, any surface treatment, any substrate cool down, and/or preheating treatment. The processing temperature ranges of the process chambers 410, 412, 414, 418, 420 are comparable such that in-situ substrate processing can be obtained in the substrate processing systems 300A, 300B, 400, 500 of the invention.

A shaft 987 extends through the bottom 954 of the chamber body 902 and couples the substrate support 904 to a lift mechanism 988. The lift mechanism 988 is configured to move the substrate support 904 between a lower position and an upper position. The substrate support 904 is depicted in an intermediate position in FIG. 9. A bellows 986 is typically disposed between the substrate support 904 and the chamber bottom 954 and provides a flexible seal therebetween, thereby maintaining vacuum integrity of the chamber volume 960.

Optionally, a shadow frame 958 and a chamber shield 962 may be disposed within the chamber body 902. The shadow frame 958 is generally configured to confine deposition to a portion of the substrate 422 exposed through the center of the shadow frame 958. When the substrate support 904 is moved to the upper position for processing, an outer edge of the substrate 422 disposed on the substrate support 904 engages the shadow frame 958 and lifts the shadow frame 958 from the chamber shield 962. When the substrate support 904 is moved into the lower position for loading and unloading the substrate 422 from the substrate support 904, the substrate support 904 is positioned below the chamber shield 962 and the access port 956. The substrate 422 may then be removed from or placed into the process chamber 900 through the access port 956 on the sidewalls 952 while cleaning the shadow frame 958 and the chamber shield 962. Lift pins (not shown) are selectively moved through the substrate support 904 to space the substrate 422 away from the substrate support 904 to facilitate the placement or removal of the substrate 422 by a transfer robot 430 or a transfer mechanism disposed exterior to the process chamber 900, such as a single arm robot or dual arm robot. The shadow frame 958 can be formed of one piece or it can be two or more work-piece fragments bonded together in order to surround the peripheral portion of the substrate 422.

PVD chambers that may be adapted to benefit from the invention are described in co-pending U.S. patent application Ser. No. 11/131,009 filed on May 16, 2005, titled "Ground Shield for a PVD chamber" by Golubovsky, titled "Substrate Movement and Process Chamber Scheduling" by White et al.; and Ser. No. 11/167,377 filed on Jun. 27, 2005, titled "Process Kit Design to Reduce Particle Generation" by Le et al., all of which are hereby incorporated by reference in their entireties.

Other types of process chamber can also be coupled to the substrate processing systems of the invention. One example is an etching chamber to perform etching of one or more metal and silicon-containing films of the invention. Another example is a heat chamber that thermally conditions substrates prior to processing to condition the substrate 422 ready for a desired processing temperature and enhance throughput of the substrate processing system. The heat chamber can also be used to anneal one or more films on the substrate 422 after one or more metal and silicon-containing films of the invention are deposited on the substrate. Alternatively, the heat chamber can be used to perform ashing and other processes.

The invention is illustratively described above for a flat panel processing system, such as those PVD chambers, transfer chambers, and load lock chambers available from AKT, a division of Applied Materials, Inc., Santa Clara, Calif. However, it should be understood that the invention has utility in other system configurations, wherever high throughput substrate processing is desired.

As shown in FIGS. 3A-5 and in FIG. 9, the controller 590 is included to interface with and control various components of the substrate processing systems 300A, 300B, 400, 500. The controller 590 typically includes a central processing unit (CPU) 594, support circuits 596 and a memory 592. The CPU 594 may be one of any form of computer processor that can be used in an industrial setting for controlling various chambers, apparatuses, and chamber peripherals. The memory 592, any software, or any computer-readable medium coupled to the CPU 594 may be one or more readily available memory devices, such as random access memory (RAM), read only memory (ROM), hard disk, CD, floppy disk, or any other form of digital storage, for local or remote for memory storage. The support circuits 596 are coupled to the CPU 594 for supporting the CPU 594 in a conventional manner. These circuits include cache, power supplies, clock circuits, input/output circuitry, subsystems, and the like.

The controller 590 may be used to control operation of the substrate processing system, including any transferring among the load lock chamber 404, the transfer chamber 408, the first and second PVD chambers 410, 412, process chambers 414, 418, 420, and deposition processes performed therein. The controller 590 is also used to control processing/deposition time performed by the process chambers, and the timing for transferring in and out of the load lock chamber, the transfer chamber, and the process chambers according to a predetermined fabrication sequence for one or more substrates to be processed.

In one embodiment, the controller 590 of the invention is used to control movements of one or more substrates being processed concurrently within the substrate processing systems. Specifically, the control of substrate movement by various substrate transfer or loading mechanisms (e.g., transfer chambers 408, load lock chamber 404, etc.) and any software associated therewith are linked to the software required for controlling different process time and process conditions for the process chambers or PVD chambers of the invention. In one aspect, the same software, as compared to prior art separate softwares or commands, is used to control the movement of various substrate transfer mechanisms, such as the robot 430 and a substrate support positioned inside a process chamber, such that the movements of one or more substrate supports in one or more process chambers are engaged or coordinated when the substrate being processed is being transferred to the process chamber from the previous substrate transfer mechanism, transfer chamber, load lock chamber.

One embodiment of the invention also provides maintaining of various pressure levels inside the various chambers and components of the substrate processing system 300A, 300B, 400, 500 using the controller 590 to control various pumps coupled thereto, such as a cryogenic pump, a turbo pump, a regular dry pump, among others. For example, a PVD chamber of the invention can be maintained at a highly vacuum level, such as at about $10^{-6}$ Torr to about $10^{-7}$ Torr. A transfer chamber of the invention coupled to a PVD chamber may be maintained at about $10^{-5}$ Torr to about $10^{-6}$ Torr, or other levels. A load lock chamber of the invention coupled to a PVD chamber may be maintained at an intermediate pressure level of about 0.5 Torr or less, such as about $10^{-4}$ Torr or less, or other levels. However, the invention is not limited to the above mentioned exemplary pressure ranges.

Figure 13A:
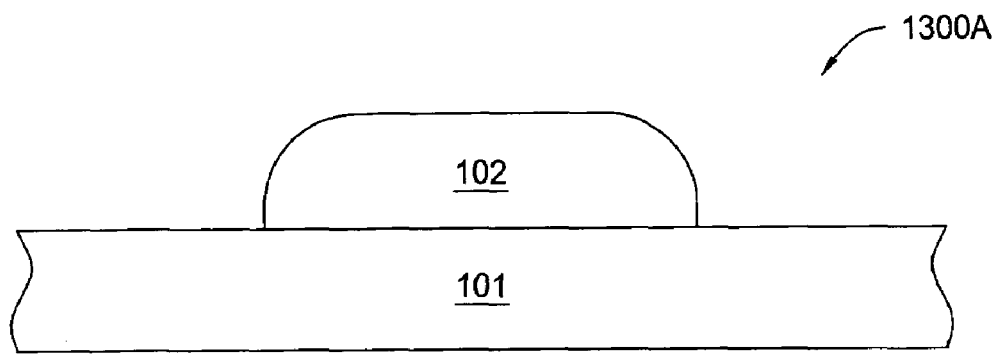
FIGS. 13A-13D depict a cross-sectional schematic view of fabricating an exemplary bottom gate thin film transistor using methods of the invention according to one embodiment of the invention.

FIGS. 13A-13E depict a cross-sectional schematic view of fabricating one exemplary substrate structure formed by the method 200 of the invention, such as a bottom gate thin film transistor (TFT) formed on a substrate 101. In FIG. 13A, the film stack 1300A includes a gate electrode layer 102 deposited and patterned on the surface of the substrate 101 using the substrate processing systems of the invention. The thickness of the gate electrode layer 102 is not limiting and may range from about 100 Å to about 4000 Å. The gate electrode layer 102 may include an electrically conductive material, such as a metal material, for example, aluminum (Al), molybdenum (Mo), neodymium (Nd), aluminum neodymium (AlNd), aluminum nitride ($Al_xN_y$), molybdenum nitride ($Mo_xN_y$), tantalum (Ta), titanium (Ti), titanium nitride (TiN), tantalum nitride (TaN), copper (Cu), tungsten (W), chromium (Cr), other metals, metal nitrides, their alloys, and combinations thereof, among others, to control the movement of charge carriers within the thin film transistor. Between the substrate 101 and the gate electrode layer 102, there may be an optional layer of an insulating material, such as silicon dioxide ($SiO_2$), silicon nitride (SiN), among others. The gate electrode layer 102 is then applied with a layer of photoresist, lithographically patterned, and etched to define the gate electrode.

The gate electrode layer 102 may be formed according to one or more embodiments of the method and substrate processing systems described herein. For example, an aluminum neodymium layer and a molybdenum layer can be deposited onto one or more substrates using two designated process chambers 410, 412 of the invention. The process time for each layer of aluminum neodymium and molybdenum is about 1 minute or less and about 12 second or less, respectively, to obtain a thickness of about 2500 Å and about 500 Å, respectively. For the substrate processing system 300A, 300B, an increased substrate throughput of at least about 41 substrates per hour is very desirably obtained. Alternatively, the aluminum neodymium and molybdenum film stack can also be deposited using three designated process chambers 410, 412, 414 of the invention. For example, the substrate processing system 400 can be configured into two process chambers designated for aluminum neodymium deposition and one process chamber designated for molybdenum deposition, to obtain an increased substrate throughput of at least about 54 substrates per hour.

As another example, a first layer of about 500 Å of molybdenum and a second layer of about 2000 Å copper can be deposited onto one or more substrates using two designated process chambers of the invention for a process time of about 12 second or less and about 45 seconds or less, respectively, to obtain a high substrate throughput of at least about 44 substrates per hour. Alternatively, using three designated process chambers, one chamber designated for the first molybdenum layer of a smaller thickness and two process chambers designated for the second copper layer of a larger thickness, a high substrate throughput of at least about 54 substrates per hour is obtained.

Figure 13B:
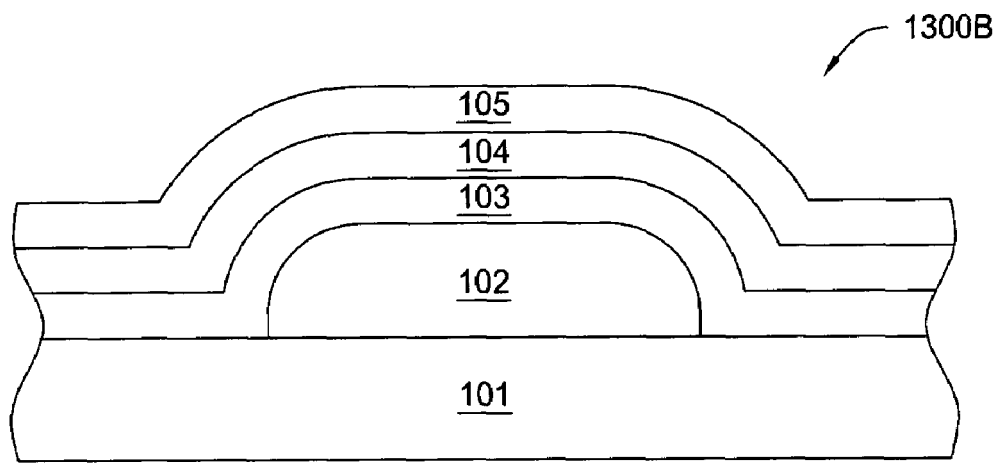

In FIG. 13B, the film stack 1300B further includes one or more silicon-containing layers, for example, a gate insulation layer 103 and a semiconductive layer formed over the gate electrode layer 102. In one embodiment, the semiconductive layer in the film stack includes one or more silicon-containing layers. For example, a bulk semiconductor layer 104 and a doped semiconductor layer 105 can be formed over the gate insulation layer 103. The doped semiconductor layer 105 directly contacts portions of the bulk semiconductor layer 104, forming a semiconductor junction.

The gate insulation layer 103 may include a dielectric material, such as silicon nitride (SiN), silicon oxynitride (SiON), silicon dioxide ($SiO_2$), among others. The gate insulation layer 103, which also serves as storage capacitor dielectric, may be formed to a thickness in the range of about 100 Å to about 6000 Å. One example of the gate insulation layer 103 is a silicon nitride film deposited by a CVD process chamber.

The bulk semiconductor layer 104 may comprise amorphous silicon ($\alpha$-Si), polycrystalline silicon (polysilicon), silicon dioxide ($SiO_2$), and other silicon materials. The bulk semiconductor layer 104 may be deposited to a thickness in the range of about 100 Å to about 3000 Å. One example of the bulk semiconductor layer 104 is an $\alpha$-Si film deposited by a CVD process chamber.

The doped semiconductor layer 105 formed on top of the semiconductor layer 104 may comprise n-type (n+) amorphous silicon ($\alpha$-Si), doped p-type (p+) doped amorphous silicon ($\alpha$-Si), n+ doped polycrystalline (polysilicon), p+ polycrystalline (polysilicon), among others. The doped semiconductor layer 105 may be deposited to a thickness within a range of about 100 Å to about 3000 Å. One example of the doped semiconductor layer 105 is a n+ doped $\alpha$-Si film deposited by a CVD process chamber.

Figure 13C:
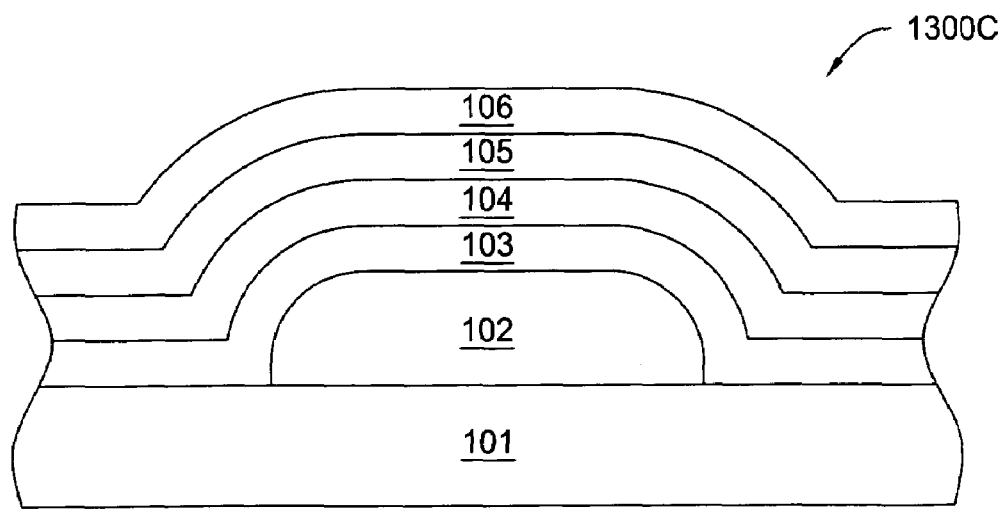

In FIG. 13C, the film stack 1300C further includes a conductive layer 106 deposited on the exposed surface of the silicon-containing semiconductor layers using one or more PVD process chambers of the substrate processing system of the invention. The conductive layer 106 may be deposited to a thickness within a range of about 100 Å to about 6000 Å. The conductive layer 106 may comprise a metal material, for example, aluminum (Al), molybdenum (Mo), neodymium (Nd), aluminum neodymium (AlNd), aluminum nitride ($Al_xN_y$), molybdenum nitride ($Mo_xN_y$), tantalum (Ta), titanium (Ti), titanium nitride (TiN), tantalum nitride (TaN), copper (Cu), tungsten (W), chromium (Cr), other metal nitrides, their alloys, and combinations thereof, among others.

For example, in accordance with one or more embodiments of the invention, a conductive layer including a first molybdenum layer, a second aluminum layer, and a third molybdenum layer can be deposited onto one or more substrates using two designated process chambers 410, 412 of the invention for a process time of about 24 seconds or less, 1 minutes or less, and about 12 second or less, respectively, to obtain a thickness of about 1000 Å, about 2500 Å and about 500 Å, respectively. In this example, two process chambers are designated for depositing the three metal layers to form into a conductive layer 106 of a TFT structure, where the two molybdenum layers is deposited in a first PVD chamber having a molybdenum-containing target and the second aluminum layer is deposited by a second PVD chamber having a aluminum-containing target. By transferring one or more substrates to be processed into and out of the first PVD chamber and the second PVD chamber, and back to the first PVD chamber, sequentially, a high substrate throughput of at least about 30 substrates per hour for the substrate processing system 300A, 300B is desirably obtained. Alternatively, a conductive layer containing molybdenum, aluminum, and molybdenum can also be deposited using three designated process chambers 410, 412, 414 of the invention, two process chambers designated for aluminum neodymium deposition and one process chamber designated for molybdenum deposition. For example, using the substrate processing system 400, an increased substrate throughput of at least about 37 substrates per hour is obtained.

As another example, a single layer of a conductive molybdenum layer at a thickness of about 2500 Å can be deposited onto one or more substrates using the substrate processing systems of the invention for a process time of about 1 minute or less to obtain a high substrate throughput of at least about 71 substrates per hour if two process chambers are used.

The film stack 1300B and 1300C may be additionally patterned and etched to form into active regions, channels, source and drains, and contacts, etc. In addition, a passivation layer 107 may be deposited to conformably coats exposed surfaces of the film stack and over the channels and the source and drain contacts of the TFT structure. The passivation layer 107 is generally an insulator and may comprise a dielectric material, for example, silicon dioxide ($SiO_2$), silicon nitride (SiN), among others. The passivation layer 107 may be formed using, for example, PECVD and other deposition process. The passivation layer 107 may be deposited to a thickness of about 100 Å or larger, such as in the range of about 1000 Å to about 5000 Å. The passivation layer 107 is then lithographically patterned and etched using conventional techniques to open contact holes in the passivation layer 107.

Further, a transparent conductor layer 108 may be deposited and patterned to make contacts with the conductive layer 106. The transparent conductor layer 108 comprises a material that is essentially optically transparent in the visible spectrum and is electrically conductive. The transparent conductor layer 108 may comprise, for example, indium tin oxide (ITO) or zinc oxide, among others. Patterning of the transparent conductive layer 108 is accomplished by conventional lithographical and etching techniques.

Figure 13D:
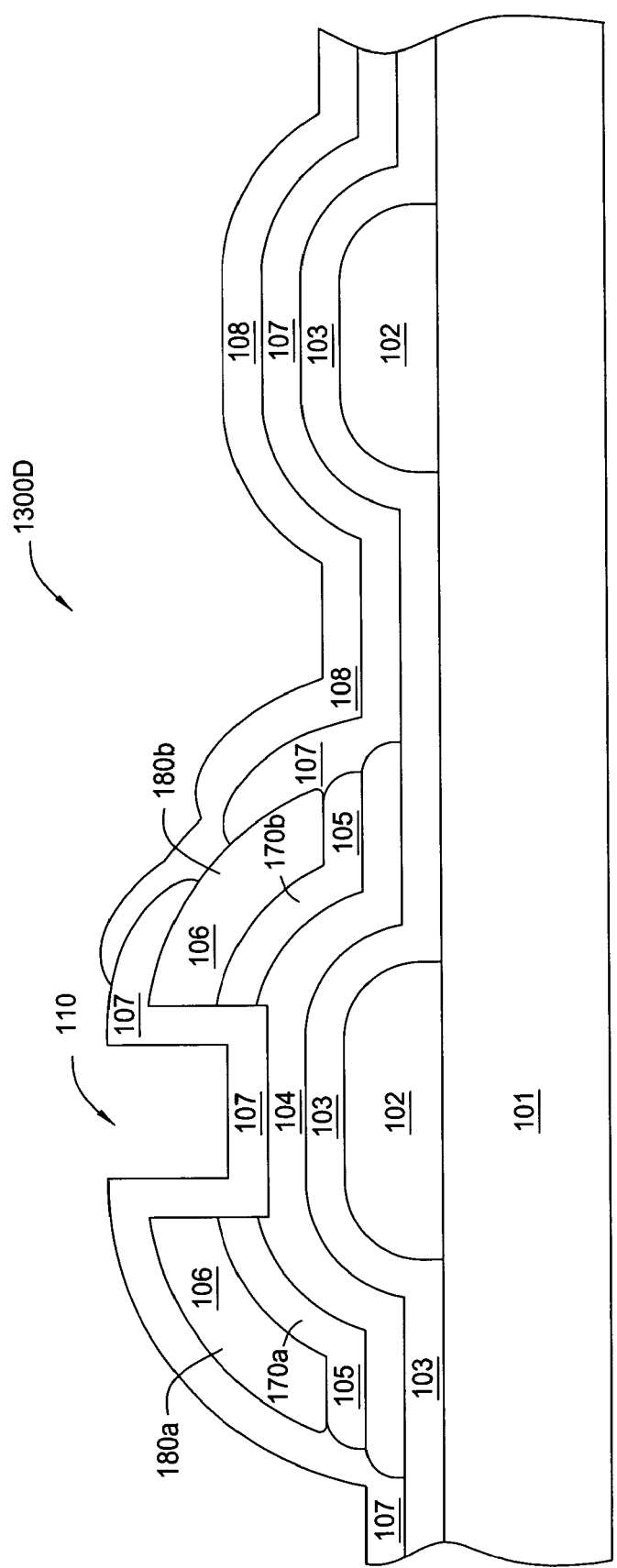

Finally, as shown in FIG. 13D, the film stack 1300D of the invention generally include a source region and a drain region in the doped semiconductor layer 105, and a source contact region 180a and a drain contact region 180b in the conductive layer 106; for example, channel 110 can be formed in active regions between the source and drain contacts.

While the foregoing is directed to embodiments of the present invention, other and further embodiments of the invention may be devised without departing from the basic scope thereof, and the scope thereof is determined by the claims that follow.

The invention claimed is:

1. A method of processing a film stack containing two or more metal-containing layers on a substrate in a substrate processing system, comprising:
    depositing a molybdenum layer to a thickness of about 100 Å to about 1500 Å on the substrate in a first physical vapor deposition (PVD) chamber of the substrate processing system having a first target which comprises molybdenum;
    transferring the substrate to a second PVD chamber of the same substrate processing system; and
    depositing a layer of a material selected from the group consisting of aluminum (Al), neodymium (Nd), aluminum neodymium (AlNd), molybdenum nitride ($Mo_xN_y$), copper (Cu), their metal nitrides, metal alloys, and combinations thereof to a thickness of about 1750 Å to about 3500 Å on the surface of the substrate without breaking vacuum in the second PVD chamber having a second target which comprises said material, wherein the thickness of the molybdenum layer is less than the thickness of said material layer, wherein the throughput of the substrate processing system is about 40 substrates or more per hour.

2. A method of processing a film stack containing two or more metal-containing layers on a substrate in a substrate processing system, comprising:
    depositing a molybdenum layer to a thickness of about 100 Å to about 1500 Å on the substrate in a first physical vapor deposition (PVD) chamber of the substrate processing system having a first target which comprises molybdenum;
    transferring the substrate to a second PVD chamber of the same substrate processing system; and
    depositing a layer of a material selected from the group consisting of aluminum (Al), neodymium (Nd), aluminum neodymium (AlNd), molybdenum nitride ($Mo_xN_y$), copper (Cu), their metal nitrides, metal alloys, and combinations thereof to a thickness of about 1750 Å to about 3500 Å on the surface of the substrate without breaking vacuum in the second PVD chamber having a second target which comprises said material, wherein the thickness of the molybdenum layer is less than the thickness of said material layer, wherein the substrate processing system is configured to process one or more large area rectangular substrates of about one square meter or larger.

3. A method of processing a film stack containing two or more metal-containing layers on a substrate in a substrate processing system, comprising:
    depositing a molybdenum layer to a thickness of about 100 Å to about 1500 Å on the substrate in a first physical vapor deposition (PVD) chamber of the substrate processing system having a first target which comprises molybdenum;
    transferring the substrate to a second PVD chamber of the same substrate processing system; and
    depositing a layer of a material selected from the group consisting of aluminum (Al), neodymium (Nd), aluminum neodymium (AlNd), molybdenum nitride ($Mo_xN_y$), copper (Cu), their metal nitrides, metal alloys, and combinations thereof to a thickness of about 1750 Å to about 3500 Å on the surface of the substrate without breaking vacuum in the second PVD chamber having a second target which comprises said material, wherein the thickness of the molybdenum layer is less than the thickness of said material layer, further comprising transferring the substrate back to the first PVD chamber and depositing another molybdenum layer on the surface of the substrate in the first PVD chamber without breaking vacuum, wherein the throughput of the substrate processing system is about 30 substrates or more per hour.

4. A method of processing a film stack containing two or more metal-containing layers on two or more substrates in a substrate processing system having three or more physical vapor deposition (PVD) chambers, comprising:
    depositing on a first substrate a first molybdenum layer to a thickness of about 100 Å to about 1500 Å in a first PVD chamber of the substrate processing system having a first target which comprises molybdenum;
    transferring the first substrate to a second PVD chamber having a second target which comprises a material selected from the group consisting of aluminum (Al), neodymium (Nd), aluminum neodymium (AlNd), molybdenum nitride ($Mo_xN_y$), copper (Cu), their metal nitrides, metal alloys, and combinations thereof;
    depositing on a second substrate a second molybdenum layer to a thickness of about 100 Å to about 1500 Å in the first PVD chamber;
    transferring the second substrate to a third PVD chamber of the same substrate processing system having a third target which comprises said material;
    depositing a first layer of said material to a thickness of about 1750 Å to about 3500 Å over the first molybdenum layer on the surface of the first substrate in the second PVD chamber without breaking vacuum; and
    depositing a second layer of said material to a thickness of about 1750 Å to about 3500 Å over the second molybdenum layer on the surface of the second substrate in the third PVD chamber without breaking vacuum, wherein the thickness of the first molybdenum layer is less than the thickness of the first layer of said material on the surface of the first substrate and the thickness of the second molybdenum layer is less than the thickness of the second layer of said material on the surface of the second substrate.

5. The method of claim 4, wherein the substrate processing system is configured to process one or more large area rectangular substrates of about one square meter or larger and the throughput of the substrate processing system is about 50 substrates or more per hour.

6. A method of processing a film stack containing two or more metal-containing layers on two or more substrates in a substrate processing system having three or more PVD chambers, comprising:

depositing on a first substrate a first layer of a material selected from the group consisting of aluminum (Al), neodymium (Nd), aluminum neodymium (AlNd), molybdenum nitride ($Mo_xN_y$), copper (Cu), their metal nitrides, metal alloys, and combinations thereof to a thickness of about 1750 Å to about 3500 Å in a first PVD chamber of the substrate processing system having a first target which comprises said material;

depositing on a second substrate a second layer of said material to a thickness of about 1750 Å to about 3500 Å in a second PVD chamber of the same substrate processing system having a second target which comprises said material;

transferring the first substrate to a third PVD chamber of the same substrate processing system having a third target which comprises molybdenum;

depositing on the surface of the first substrate a first molybdenum layer to a thickness of about 100 Å to about 1500 Å over the first layer of said material in the third PVD chamber without breaking vacuum;

transferring the second substrate to the third PVD chamber; and depositing on the surface of the second substrate a second molybdenum layer to a thickness of about 100 Å to about 1500 Å over the second layer of said material in the third PVD chamber without breaking vacuum, wherein the thickness of the first layer of said material is more than the thickness of the first molybdenum layer on the surface of the first substrate and the thickness of the second layer of said material is more than the thickness of the second molybdenum layer on the surface of the second substrate.

7. The method of claim 6, wherein the substrate processing system is configured to process one or more large area rectangular substrates of about one square meter or larger and the throughput of the substrate processing system is about 50 substrates or more per hour.

* * * * *

UNITED STATES PATENT AND TRADEMARK OFFICE
CERTIFICATE OF CORRECTION

PATENT NO.         : 7,432,184 B2
APPLICATION NO. : 11/213662
DATED                  : October 7, 2008
INVENTOR(S)        : Hosokawa et al.

It is certified that error appears in the above-identified patent and that said Letters Patent is hereby corrected as shown below:

In the Detailed Description:

Column 6, Line 40, please delete "PVtD" and insert --PVD-- therefor;

Column 7, Line 15, please delete "521";

Column 16, Line 66, please delete "kurita" and insert --Kurita-- therefor.

Signed and Sealed this

Tenth Day of February, 2009

JOHN DOLL
*Acting Director of the United States Patent and Trademark Office*

UNITED STATES PATENT AND TRADEMARK OFFICE
CERTIFICATE OF CORRECTION

| | |
|---|---|
| PATENT NO. | : 7,432,184 B2 |
| APPLICATION NO. | : 11/213662 |
| DATED | : October 7, 2008 |
| INVENTOR(S) | : Hosokawa et al. |

It is certified that error appears in the above-identified patent and that said Letters Patent is hereby corrected as shown below:

Title Page

In the References Cited (56):

Please delete "6,352,620 B2 3/2002 Yu et al." and insert --6,635,620 B1 10/2003 Yagi et al.-- therefor.

Signed and Sealed this

Twenty-eighth Day of April, 2009

JOHN DOLL
*Acting Director of the United States Patent and Trademark Office*